US011458561B2

(12) United States Patent
Hamaguchi et al.

(10) Patent No.: US 11,458,561 B2
(45) Date of Patent: Oct. 4, 2022

(54) ELECTRON BEAM COLUMN FOR THREE-DIMENSIONAL PRINTING DEVICE, THREE-DIMENSIONAL PRINTING DEVICE, AND THREE-DIMENSIONAL PRINTING METHOD

(71) Applicant: ADVANTEST CORPORATION, Tokyo (JP)

(72) Inventors: Shinichi Hamaguchi, Tokyo (JP); Shinji Sugatani, Tokyo (JP); Masayuki Takahashi, Tokyo (JP); Masahiro Takizawa, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 377 days.

(21) Appl. No.: 16/344,359

(22) PCT Filed: Jan. 12, 2017

(86) PCT No.: PCT/JP2017/000770
§ 371 (c)(1),
(2) Date: Apr. 24, 2019

(87) PCT Pub. No.: WO2018/131109
PCT Pub. Date: Jul. 19, 2018

(65) Prior Publication Data
US 2019/0337085 A1 Nov. 7, 2019

(51) Int. Cl.
*B23K 15/00* (2006.01)
*B33Y 10/00* (2015.01)
(Continued)

(52) U.S. Cl.
CPC ........ *B23K 15/0086* (2013.01); *B23K 15/002* (2013.01); *B23K 15/004* (2013.01);
(Continued)

(58) Field of Classification Search
CPC ...... H01J 37/063; H01J 37/145; H01J 37/141; H01J 37/06; H01J 37/147; H01J 37/305;
(Continued)

(56) References Cited

U.S. PATENT DOCUMENTS 3,519,873 A * 7/1970 O'Keefe ................. H01J 37/30
315/10
4,075,488 A * 2/1978 Okayama ............ H01J 37/3007
250/396 R
(Continued)

FOREIGN PATENT DOCUMENTS

CN 104010749 A 8/2014
CN 104972118 A 10/2015
(Continued)

OTHER PUBLICATIONS

Notice of First Office Action for Patent Application No. 201780058136 X, issued by The National Intellectual Property Administration of the People's Republic of China dated Aug. 3, 2020.
(Continued)

*Primary Examiner* — Ibrahime A Abraham
*Assistant Examiner* — Simpson A Chen

(57) ABSTRACT

To provide a three-dimensional printing device that irradiates approximately the same ranges on the surface of a powder layer simultaneously with a plurality of electron beams having different beam shapes. An electron beam column 200 of the three-dimensional printing device 100 includes a plurality of electron sources 20 including electron sources having anisotropically-shaped beam generating units, and beam shape deforming elements 30 that deform the beam shapes of electron beams output from the electron sources 20 on a surface 63 of a powder layer 62. A deflector 50 included in the electron beam column 200 deflects an electron beam output from each of the plurality of electron sources 20 by a distance larger than the beam space between electron beams before passing through the deflector 50.

6 Claims, 29 Drawing Sheets

(51) Int. Cl.
*B33Y 30/00* (2015.01)
*B33Y 50/02* (2015.01)
*H01J 37/06* (2006.01)
*H01J 37/141* (2006.01)
*H01J 37/147* (2006.01)
*H01J 37/305* (2006.01)
*H01J 29/56* (2006.01)

(52) U.S. Cl.
CPC ...... *B23K 15/0013* (2013.01); *B23K 15/0026* (2013.01); *B33Y 10/00* (2014.12); *B33Y 30/00* (2014.12); *B33Y 50/02* (2014.12); *H01J 29/563* (2013.01); *H01J 37/06* (2013.01); *H01J 37/141* (2013.01); *H01J 37/147* (2013.01); *H01J 37/305* (2013.01); *H01J 2237/3128* (2013.01)

(58) Field of Classification Search
CPC ........ H01J 2237/3128; B23K 15/0086; B23K 15/0013; B23K 15/002; B23K 15/0026; B23K 15/004; B33Y 10/00; B33Y 30/00; B33Y 50/02
USPC ............... 219/76.1, 121.12–121.18
See application file for complete search history.

(56) References Cited

U.S. PATENT DOCUMENTS

| | | | |
|---|---|---|---|
| 4,468,586 A | * | 8/1984 | Hohn ............ H01J 37/06 313/336 |
| 7,454,262 B2 | | 11/2008 | Larsson |
| 8,187,521 B2 | | 5/2012 | Larsson |
| 9,415,443 B2 | | 8/2016 | Ljungblad |
| 2009/0050802 A1 | | 2/2009 | Noji |
| 2013/0313429 A1 | | 11/2013 | Noji |
| 2014/0348691 A1 | | 11/2014 | Ljungblad |
| 2014/0348692 A1 | | 11/2014 | Bessac |
| 2015/0004045 A1 | * | 1/2015 | Ljungblad ............ B22F 3/003 419/47 |
| 2015/0270088 A1 | | 9/2015 | Satoh |
| 2015/0283612 A1 | | 10/2015 | Maeda |
| 2016/0332228 A1 | * | 11/2016 | Mackie ............ B33Y 50/02 |

FOREIGN PATENT DOCUMENTS

| | | | |
|---|---|---|---|
| CN | 105195742 A | 12/2015 | |
| CN | 105339114 A | 2/2016 | |
| CN | 105408039 A | 3/2016 | |
| JP | S58193541 U | 12/1983 | |
| JP | S6264036 A | 3/1987 | |
| JP | S62194614 A | 8/1987 | |
| JP | 62-206754 A | * 9/1987 | ............ H01J 37/06 |
| JP | S62213051 A | 9/1987 | |
| JP | 2008155538 A | 7/2008 | |
| JP | 2015170571 A | 9/2015 | |
| JP | 2015193883 A | 11/2015 | |

OTHER PUBLICATIONS

International Search Report and (ISA/237) Written Opinion of the International Search Authority for International Patent Application No. PCT/JP2017/000770, issued/mailed by the Japan Patent Office dated Mar. 7, 2017.

* cited by examiner

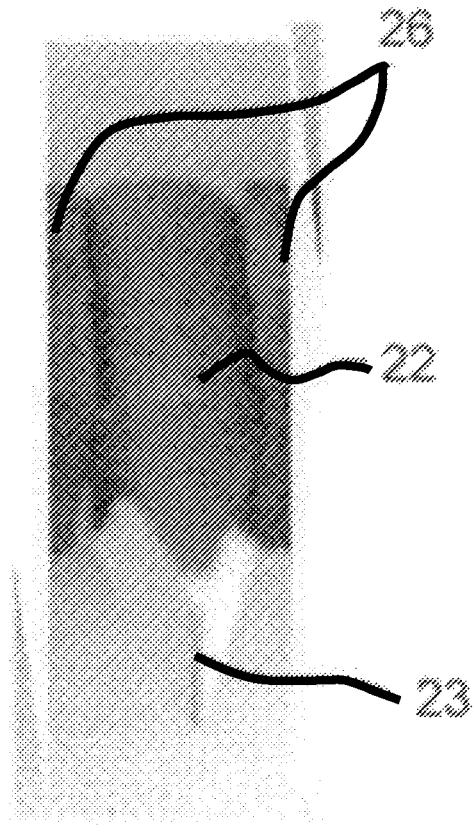
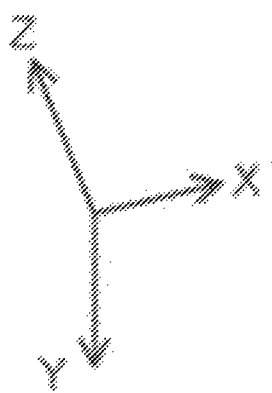
FIG. 3B

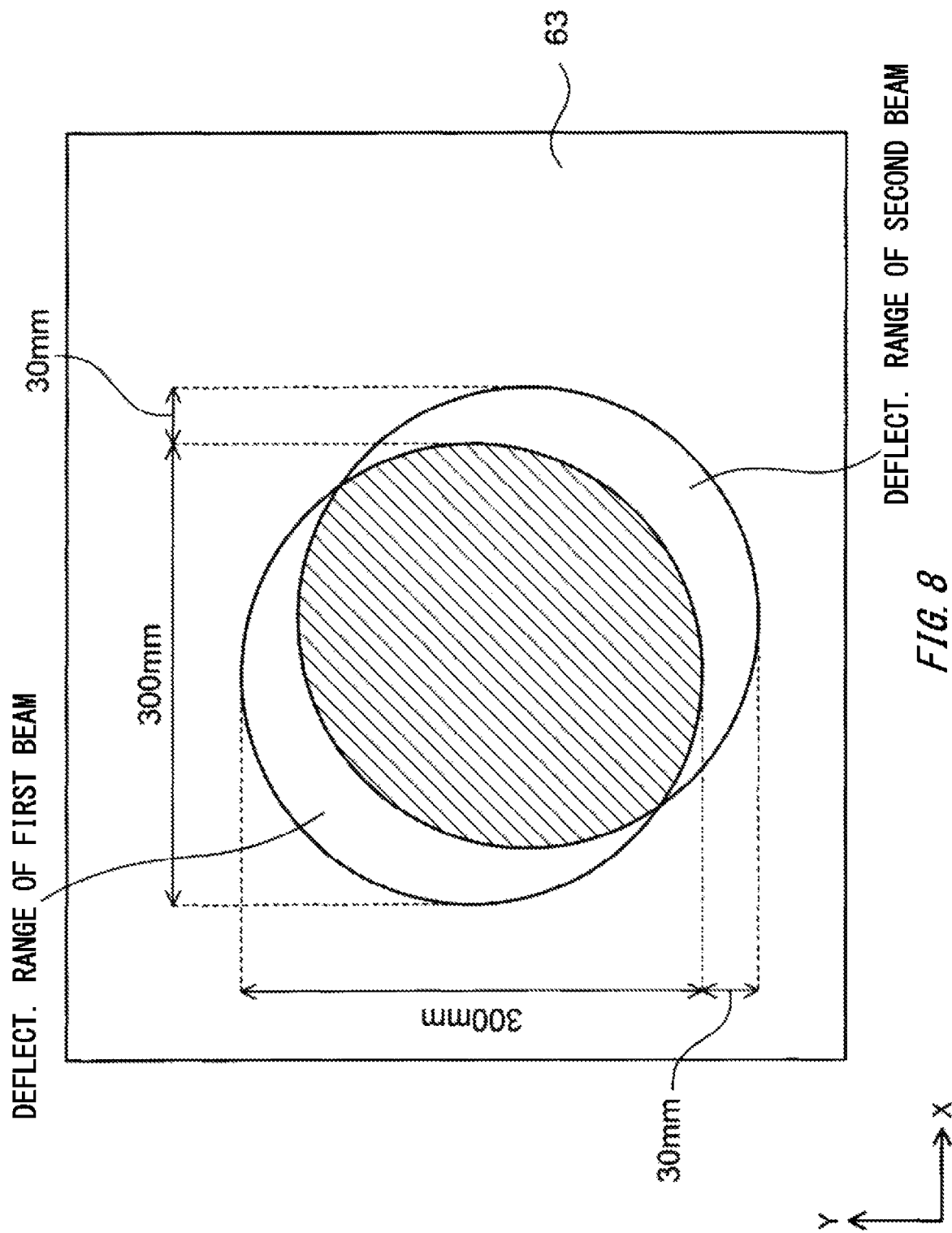

ELECTRON BEAM COLUMN FOR THREE-DIMENSIONAL PRINTING DEVICE, THREE-DIMENSIONAL PRINTING DEVICE, AND THREE-DIMENSIONAL PRINTING METHOD

CROSS-REFERENCE TO RELATED APPLICATIONS

This application is a National Stage entry of International Patent Application No. PCT/JP2017/000770, filed on Jan. 12, 2017, the contents of which are hereby incorporated by reference in its entirety.

BACKGROUND

1. Technical Field

The present invention relates to an electron beam column for three-dimensional printing device, a three-dimensional printing device, and a three-dimensional printing method.

2. Related Art

Known three-dimensional printing devices manufacture a three-dimensional structure by irradiating predetermined ranges on surfaces of powder layers made of metal materials or the like with electron beams, forming cross-section layers by melting and solidifying part of the powder layers, and layering such cross-sectional layers (see Patent Literatures 1, 2, for example). In addition, configuration examples of electron beam columns provided to three-dimensional printing devices are known (see Patent Literatures 3, 4, for example).

PRIOR ART LITERATURES

Patent Literatures

[Patent Literature 1] U.S. Pat. No. 7,454,262
[Patent Literature 2] U.S. Pat. No. 8,187,521
[Patent Literature 3] Japanese Patent Application Publication No. 2015-167125
[Patent Literature 4] Japanese Patent Application Publication No. 2015-193883
[Patent Literature 5] U.S. Pat. No. 9,415,443

Conventional three-dimensional printing devices perform preliminary irradiation of preheating a surface of a powder layer by irradiating the surface with an electron beam at an intensity not as high as the layer-melting intensity, and then form a cross-section layer by irradiating the powder layer with an electron beam at the layer-melting intensity (melting irradiation).

When preliminary irradiation and melting irradiation using electron beams are performed, significant differences in irradiation conditions between them are coped with by controlling the voltage of a control electrode of an electron gun, for example, to thereby change the beam current value, or by other means (see Patent Literature 3, for example).

However, changing the beam current value of an electron source gives rise to drawbacks such as: deterioration of reproducibility of electron beams since characteristics of the electron source related to generation of electron beams change in a complicated manner; or lowering of the processing speed since it becomes necessary to wait for a while until electron beams become stabilized.

SUMMARY

A first aspect of the present invention provides an electron beam column for a three-dimensional layering device, the electron beam column including: a first electron source that outputs a first electron beam accelerated to a predetermined acceleration voltage; a second electron source that outputs a second electron beam accelerated to a predetermined acceleration voltage; a first beam shape deforming element that deforms a cross-sectional shape of the first electron beam; a second beam shape deforming element that deforms a cross-sectional shape of the second electron beam; an electromagnetic lens that converges the first electron beam and the second electron beam; and a deflector that adjusts irradiation positions of the first electron beam and the second electron beam in a deflectable range larger than a space between the first electron beam and the second electron beam.

In addition, a second aspect of the present invention provides a three-dimensional printing device: the electron beam column; a manufacturing container that holds a powder layer; a powder supply device that supplies a new powder layer to a surface of the manufacturing container; and a control unit that, based on three-dimensional structure manufacturing data, performs simultaneous irradiation using the first electron beam and the second electron beam, and causes a predetermined range of the powder layer to be melted and solidified.

A third aspect of the present invention provides a three-dimensional printing method including: supplying a powder layer; (i) performing melting irradiation by scanning a manufacturing region which is part of a surface of the powder layer with a first electron beam having an electron beam density at which the power layer can be melted, and simultaneously (ii) performing preliminary irradiation of a region larger than the manufacturing region using a second electron beam shaped to have a cross-section larger than the first electron beam; and performing outlining irradiation of the manufacturing region by scanning the manufacturing region along an edge of the manufacturing region with the second electron beam that is narrowed, and is at an electron beam density capable of melting the powder layer. The summary clause does not necessarily describe all necessary features of the embodiments of the present invention. The present invention may also be a sub-combination of the features described above.

BRIEF DESCRIPTION OF THE DRAWINGS

FIG. 3B is a figure illustrating the configuration example of the cathode portion 22, the electron emitting surface 23, and the heating unit 26 of the electron source 20 according to the first embodiment.

FIG. 8 is a figure illustrating ranges to which a first electron beam, and a second electron beam are deflected in in-plane directions of the surface of a powder layer by a common deflector 50.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
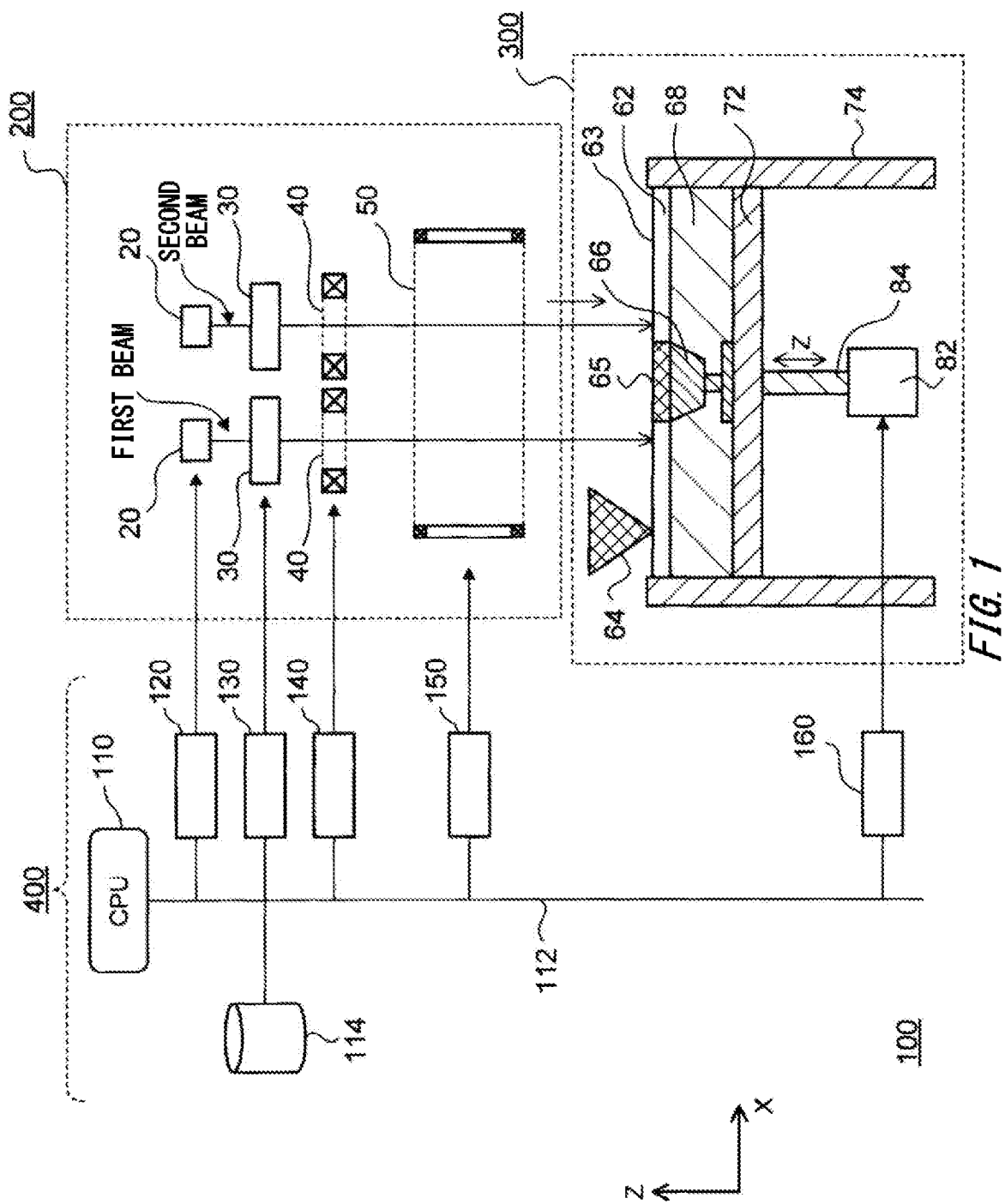
FIG. 1 illustrates a configuration example of a three-dimensional printing device 100 according to a first embodiment.

FIG. 1 illustrates a configuration example of a three-dimensional printing device 100 according to the present embodiment. The three-dimensional printing device 100 includes an electron beam column 200, a manufacturing unit 300, and a control unit 400.

The control unit 400 outputs a control signal to control an electron beam output by the electron beam column 200, and irradiates, with the electron beam, a predetermined range on a surface 63 of a powder layer 62 made, for example, of metallic powders placed in the manufacturing unit 300.

A three-dimensional structure 66 is manufactured by melting and solidifying part of the powder layer 62 irradiated with the electron beam in this manner to form a cross-section layer 65, and repeating layering such cross-section layers 65.

The electron beam column 200 includes a plurality of electron sources 20 that output electron beams. The electron sources 20 generate electrons using the action of heat or electrical fields. The electron sources 20 apply a predetermined acceleration voltage (e.g., 60 KV) to the generated electrons, accelerate the electrons in the −Z direction, and output them as an electron beam. In the example illustrated in FIG. 1, the electron beam column 200 has two electron sources 20 that output a first electron beam, and a second electron beam, respectively.

Note that the number of electron sources 20 is not limited to two in the present embodiment, but may be three or larger. In this case, the first electron beam is defined as an electron beam used mainly for melting and solidifying a cross-sectional layer of the powder layer 62, and the second electron beam is defined as an electron beam used for performing outlining irradiation or preliminary irradiation.

In the following examples explained, the numbers of electron sources 20 and electron beams are two, for simplification of explanation.

The space, in an in-plane direction of an X-Y plane, between the first electron beam and the second electron beam is equal to or smaller than 60 mm, for example, and is approximately 30 mm, for example. High voltages applied to the two electron sources 20 are both 60 KV, and are equal acceleration voltages, and so it is possible to arrange the electron sources 20 in proximity to each other, with the space of approximately 30 mm therebeween.

As described below, an electron source 20 includes a thermoelectron emitting electron gun that emits electrons from the tip of an electrode heated to a higher temperature, and the tip portion of the electrode of the electron gun has an anisotropically-shaped electron emitting surface with different longitudinal and lateral widths in mutually orthogonal directions.

An electron beam emitted from such an electron gun has an anisotropic cross-sectional shape.

In the example illustrated in FIG. 1, the electron sources 20 that output the first electron beam and the second electron beam both have an anisotropically-shaped electron emitting surface.

Note that either one of the electron sources 20 may have an electrode having an isotropically-shaped electron emitting surface such as a circular surface or a square surface, for example. An electron beam emitted from the electron source 20 including the electrode having the isotropically-shaped electron emitting surface has an isotropic cross-sectional shape.

In the present embodiment explained, both the two electron sources 20 are electron sources 20 that emit electrons from anisotropically-shaped electron emitting surfaces.

Beam shape deforming elements 30 deform cross-sectional shapes of electron beams output from the electron sources 20. In the example illustrated in FIG. 1, electron beams output from the anisotropically-shaped electron sources 20 have cross-sectional shapes that are deformed by the beam shape deforming elements 30.

The beam shape deforming elements 30 may each be an element that is formed by arranging multipole elements at multiple stages along the advancing direction of an electron beam passing therethrough in the Z-axis direction. The center of symmetry of an electric field (or a magnetic field) formed by the multipole elements on an X-Y plane coincides with the passage path of the electron beam.

Multipole elements that can be used include electrostatic quadrupole elements, for example. An electrostatic quadrupole element includes two electrodes that generate electric fields that are opposite to each other in the X-axis direction, and two electrodes that generate electric fields that are opposite to each other in the Y-axis direction.

Note that the multipole elements may be electromagnetic quadrupole elements, instead of the electrostatic quadrupole elements. Such an electromagnetic quadrupole element only has to include four electromagnetic coils that sandwich the Z axis along which an electron beam passes through the electromagnetic quadrupole element, two of the electromagnetic coils generating magnetic fields that are opposite to each other in the (X+Y) direction, and the remaining two of the electromagnetic coils generating magnetic fields that are opposite to each other in the (X−Y) direction.

Electromagnetic lenses 40 are constituted by coils wound around their lens axes, and magnetic body portions (yokes) surrounding the coils, and having spaces that are axially symmetrical about the lens axes. Such an electromagnetic lens 40 generates a local magnetic field on its lens axis and in the direction of the lens axis. Each of the first electron beam and the second electron beam illustrated in FIG. 1 passes through the electron beam column 200 along the lens axis of an electromagnetic lens 40. The lens magnetic field excited by an electromagnetic lens 40 has a lens effect of converging an electron beam passing through the electromagnetic lens 40 along a path approximately coinciding with the lens axis.

A deflector 50 deflects an electron beam to thereby adjust the irradiation position of the electron beam in in-plane directions of the surface 63 of the powder layer 62 placed in the manufacturing unit 300. One common deflector 50 may be used for deflecting a plurality of electron beams simultaneously. Instead, the deflector 50 may consist of different deflectors each for a different one of electron beams, and may deflect a plurality of electron beams separately (see FIG. 22).

The one common deflector 50 that deflects a plurality of electron beams simultaneously is desirably an electromagnetic deflector 50. In order to deflect a plurality of electron beams simultaneously, it is necessary to generate deflection fields in in-plane directions of an X-Y plane at approximately the same intensities and in approximately the same directions, along the Z-axis direction which coincides with passage paths of individual electron beams. The electromagnetic deflector 50 is desirable since, if the electromagnetic deflector 50 is used, generation of such deflection fields requires only arrangement of deflection coils around the passage paths of a plurality of electron beams so as to surround all the passage paths.

The electromagnetic deflector 50 includes two sets of deflection coils that generate independent deflection magnetic fields in the X direction and the Y direction. Each deflection coil may be a saddle deflection coil having an arc-shaped winding arranged on the circumference of a circle with a diameter of approximately 100 mm on an X-Y plane. This is because the first electron beam and the second electron beam are deflected by the magnetic fields created by the deflection coils in approximately the same directions and by approximately the same distances with errors of about several micrometers on the surface 63 of the powder layer 62.

In addition, the electromagnetic deflector 50 may have the numbers of turns of the deflection coils and the values of current to be fed through the deflection coils that are set so as to deflect each of the first electron beam and the second electron beam by 150 mm or more on the surface 63 of the powder layer 62. That is, the upper limit of the deflection distances may be 150 mm or larger. The upper limit of the deflection distances means the difference of the beam irradiation position of an electron beam on the surface 63 of the powder layer 62 between when the electron beam is not deflected, and when the electron beam is deflected most.

The upper limit (150 mm in this case) of the distance of deflection, in an in-plane direction of the surface 63 of the powder layer 62, of an electron beam output from each of the plurality of electron sources 20 is made larger than the beam space (30 mm in this case) between electron beams output from the plurality of the electron sources 20 before passing through the deflector 50.

Thereby, a common portion (overlapping portion) of the deflection ranges of the plurality of electron beams can be irradiated with each of the plurality of electron beams. In this manner, by using a different one of a plurality of electron beams having a common deflection range for either preliminary irradiation or melting irradiation, it becomes unnecessary to deform the shape of an electron beam frequently, and to enhance beam stability and reproducibility.

FIG. 1 illustrates a cross-sectional configuration example of the manufacturing unit 300. A powder sample 68 supplied from a powder supply unit 64 is held in a manufacturing container. The manufacturing container includes a bottom surface portion 72, and a side wall portion 74. The powder sample 68 supplied from the powder supply unit 64 is flattened inside the side wall portion 74 by a levelling operation of the powder supply unit 64, and forms the powder layer 62 approximately parallel with the top surface of the bottom surface portion 72. The top surface of the powder layer 62 which is to be irradiated with electron beams is called the surface 63.

The height of the bottom surface portion 72 can be varied in the Z-axis direction by a driving unit 82, and a driving rod 84. The height of the bottom surface portion 72 in the Z-axis direction is set such that the surface 63 of the powder layer 62 covering the three-dimensional structure 66 is at approximately the same height when it is irradiated with electron beams. Part of the powder layer 62 melted and solidified by irradiation using electron beams forms the cross-section layer 65, and is layered on the three-dimensional structure 66. The powder layer 62 other than the layered cross-section layer 65 is accumulated, still being left as the powder sample 68, around the three-dimensional structure 66.

The space inside the electron beam column 200 through which electron beams pass, and a space near the surface 63 of the powder layer 62 irradiated with electron beams are evacuated to attain a predetermined degree of vacuum. This is because electron beams lose energy in the atmosphere due to collision with gaseous molecules.

The three-dimensional printing device 100 includes an evacuation unit (not illustrated) for evacuating the passage paths of electron beams.

A CPU 110 included in the control unit 400 of the three-dimensional printing device 100 controls overall operations of the three-dimensional printing device 100. The CPU 110 may be a computer, a workstation, or the like having functions of an input terminal through which manipulation instructions from a user are input. The CPU 110 is connected, via a bus 112, with an electron source control unit 120, a deforming element control unit 130, a lens control unit 140, a deflection control unit 150, and a height control unit 160 that are included in the control unit 400.

Each control unit included in the control unit 400 separately controls a corresponding portion of the electron beam column 200, and the manufacturing unit 300 according to a control signal received from the CPU 110, or the like. In addition, each control unit included in the control unit 400 is connected with an external storage unit 114 via the bus 112, and receives and transfers manufacturing data stored in the external storage unit 114. The manufacturing data corresponds to the shape of a cross-section obtained when the three-dimensional structure 66 to be manufactured by the device 100 is cut through a plane orthogonal to the direction of the height of the structure 66, and defines a range of each cross-section of the three-dimensional structure 66 over which the surface 63 of the powder layer 62 is irradiated with electron beams, and melted and solidified thereby. Here, the direction of the height of the three-dimensional structure 66 corresponds to the Z-axis direction in FIG. 1. In addition, the plane orthogonal to the height direction corresponds to a plane parallel with an X-Y plane in FIG. 1.

The electron source control unit 120 applies an electron beam acceleration voltage to an electron source 20. The electron source control unit 120 outputs, to an electron source 20, a heating current for a heater for generating thermoelectrons, for example. The electron source control unit 120 outputs, to an electron source 20, a voltage for controlling an electron beam. The configurations of the electron source control unit 120, and electron sources 20 are explained in detail later.

The deforming element control unit 130 outputs voltages or currents to multipole elements of the beam shape deforming elements 30. If a beam shape deforming element is an electrostatic quadrupole element, the deforming element control unit 130 outputs voltages to two electrodes that are opposite to each other in the X-axis direction, and two electrodes that are opposite to each other in the Y-axis direction, for example. In addition, a beam shape deforming element is an electromagnetic quadrupole element, the deforming element control unit 130 outputs currents to be fed through two electromagnetic coil that are opposite to each other in the (X+Y) direction, and two electromagnetic coils that are opposite to each other in the (X-Y) direction. Settings of the magnitude of output voltage or output current for the deforming element control unit 130 define the cross-sectional shape of an electron beam with which the surface 63 of the powder layer 62 of the manufacturing unit 300 is irradiated.

The lens control unit 140 outputs a current to be fed through coil portions of the electromagnetic lenses 40. Settings of the magnitude of output current to be fed through coil portions for the lens control unit 140 define the lens intensities of electromagnetic lenses.

The deflection control unit 150 generates deflection data for electron beams for each powder layer 62 based on manufacturing data stored in the external storage unit 114. The deflection control unit 150, for example, drives two sets of deflection coils of the electromagnetic deflector 50 that are related to deflection illustrated in FIG. 1 in the X-axis direction, and Y-axis direction, and generates deflection magnetic fields for irradiating, with electron beams, positions on the surface 63 of the powder layer 62 that are determined based on the deflection data.

The height control unit 160 controls the driving unit 82, and sets the length of the driving rod 84 in the Z-axis direction, and the height of the bottom surface portion 72. Upon completion of formation of the cross-section layer 65 by melting and solidifying the powder layer 62, and every time a new powder layer 62 is supplied, the height control unit 160 lowers the bottom surface portion 72 by an amount corresponding to the thickness of the new layer, and keeps the height of the beam-irradiated surface which is the surface 63 of the new powder layer 62 covering the three-dimensional structure 66 at an approximately constant height. This is because the height of the three-dimensional structure 66 in the Z-axis direction rises every time a cross-section layer 65 is layered.

Before embodiments of the three-dimensional printing device 100 including the electron beam column 200 having the plurality of electron sources 20 are explained, one electron source 20 having an anisotropically-shaped electron emitting surface with different longitudinal and lateral widths in mutually orthogonal directions, and the accompanying column configuration, and characteristics of electron beams it are explained.

In the following explanation, a beam shape deforming element 30 is constituted by an electrostatic quadrupole element including two electrodes that generate electric fields that are opposite to each other in the X-axis direction, and two electrodes that generate electric fields that are opposite to each other in the Y-axis direction. Also if a multipole element constituting a beam shape deforming element 30 includes two electromagnetic coils that generate magnetic fields that are opposite to each other in the (X+Y) direction, and two electromagnetic coils that generate magnetic fields that are opposite to each other in the (X-Y) direction, the following explanation approximately exactly applies by interpreting electrodes as meaning electromagnetic coils, voltages as meaning currents, and so on.

Figure 2:
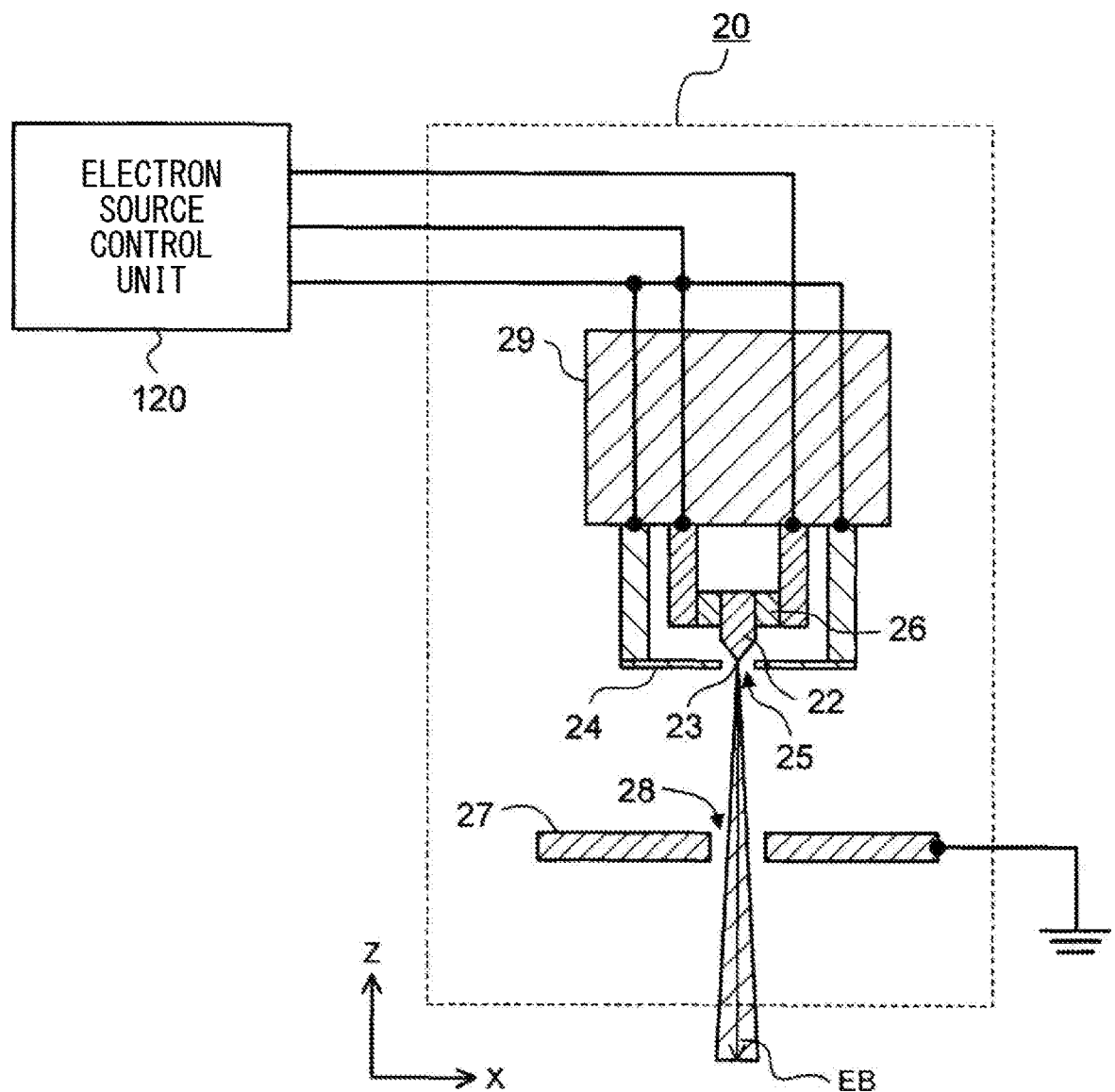
FIG. 2 illustrates a configuration example of an electron source 20, and an electron source control unit 120 according to the first embodiment.

FIG. 2 illustrates a configuration example of an electron source 20, and the electron source control unit 120 that controls the electron source 20. The electron source 20 has a cathode portion 22, an electron emitting surface 23 that generates electrons at the tip of the cathode portion 22, and a heating unit 26 for making electrons emitted from the electron emitting surface 23. The heating unit 26 is a heater made of graphite, for example, heats the entire cathode portion 22, and makes it generate thermoelectrons. The electron source 20 has a control electrode 24 that is in proximity to the electron emitting surface 23, and includes an opening 25 for allowing passage therethrough of electrons. The control electrode 24 controls the amount of electron beam to pass through the opening 25.

These constituents of the electron source 20 are insulated from a grounded portion 27 by an insulating portion 29. An acceleration voltage for accelerating an electron beam is applied across the cathode portion 22 and the grounded portion 27. The grounded portion 27 has an opening 28 for allowing passage therethrough of an electron beam. The opening 28 allows passage therethrough of an electron beam in a predetermined range of emission angle, which electron beam is part of an electron beam accelerated toward the grounded portion 27 after passing through the opening 25 of the control electrode 24. The electron source 20 outputs, to the downstream of the electron source 20 in the electron beam column 200, the electron beam having passed through the opening 28 of the grounded portion 27.

The electron source control unit 120 includes an acceleration voltage power supply. The acceleration voltage power supply applies an acceleration voltage to all of the cathode portion 22, heating unit 26, and control electrode 24 that are insulated by the insulating portion 29. The acceleration voltage in the present embodiment is 60 KV, for example. An electron beam output from the electron source 20 is accelerated to 60 KV.

The electron source control unit 120 includes a heating current power supply. The heating current power supply outputs a current to a circuit including the heating unit 26 sandwiching the cathode portion 22 of the electron source 20 from both sides in order to heat the cathode portion 22. The electron source control unit 120 may sense a current output to the heating unit 26, and a voltage generated at both ends of the heating unit 26, and control the heating current power supply.

The electron source control unit 120 includes a control electrode power supply. The control electrode power supply outputs, to the control electrode 24, a voltage for controlling an electron beam amount, for example, on a potential that results from the applied acceleration voltage. The control electrode power supply may sense an electron beam current value output by the electron source 20, and control the control electrode 24 so as to keep the beam current value constant.

Figure 3A:
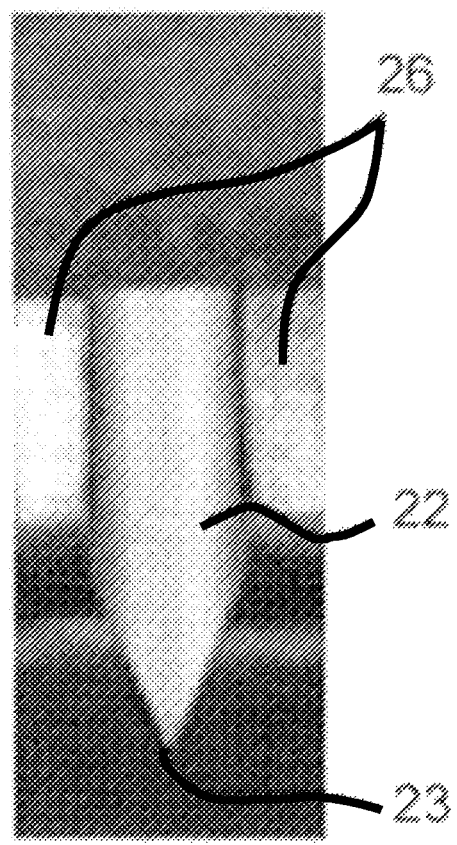
FIG. 3A is a figure illustrating a configuration example of a cathode portion 22, an electron emitting surface 23, and a heating unit 26 of the electron source 20 according to the first embodiment.
Figure 3C:
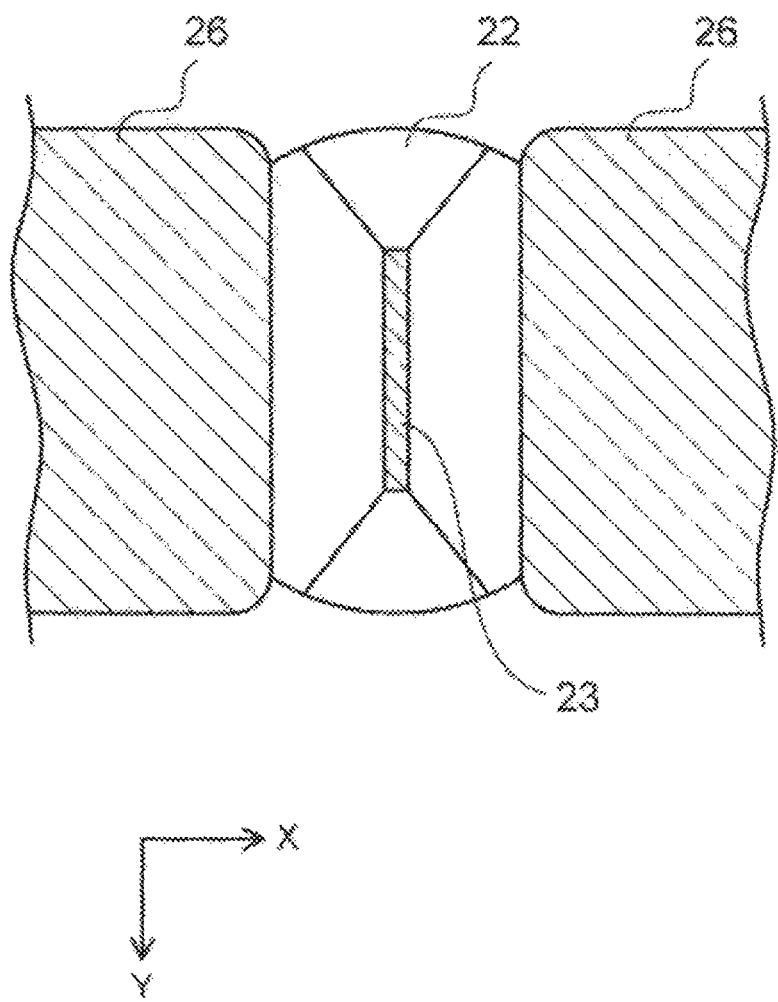
FIG. 3C is a figure illustrating the configuration example of the cathode portion 22, the electron emitting surface 23, and the heating unit 26 of the electron source 20 according to the first embodiment.

FIGS. 3A to 3C illustrate a configuration example of the cathode portion 22, electron emitting surface 23, and heating unit 26 of the electron source 20. FIG. 3A is a front view on an X-Z plane illustrating part of the cathode portion 22, electron emitting surface 23, and heating unit 26. FIG. 3B is a perspective view illustrating part of the cathode portion 22, electron emitting surface 23, and heating unit 26. Furthermore, FIG. 3C is a bottom view illustrating part of the cathode portion 22, electron emitting surface 23, and heating unit 26 as seen from the advancing direction of an electron beam. In FIGS. 3A to 3C, the X-axis direction corresponds to the lateral direction of the electron emitting surface 23, the Y-axis direction corresponds to the longitudinal direction of the electron emitting surface 23, and the Z-axis direction corresponds to the exit direction of an electron beam.

The material of the cathode portion 22 is a crystal of lanthanum hexaboride (LaB6) that is formed into a cylindrical shape, for example. The cathode portion 22 has a shape with an end portion of the cylinder being machined into a wedge-like form. The tip of the wedge has an anisotropically-shaped electron emitting surface 23 with different longitudinal and lateral widths in mutually orthogonal directions.

If the thus-shaped cathode portion 22 is heated through the heating unit 26, the electron emitting surface 23 with different lengths in the mutually orthogonal longitudinal and lateral directions generates thermoelectrons, for example. The generated electrons are accelerated by an acceleration voltage that is controlled by the control electrode 24, and applied across the cathode portion 22 and the grounded portion 27, and are output from the electron source 20 after passing through the opening 28 of the grounded portion 27.

The electron source 20 having the anisotropically-shaped electron emitting surface 23 with different longitudinal and lateral widths in mutually orthogonal directions can output larger electron beam current values as compared to an electron source having an isotropically-shaped generating unit with approximately equal longitudinal and lateral widths. This is because the electron source 20 having the anisotropically-shaped electron emitting surface 23 has an area of an electron-beam-generating portion which is greater than that of an electron source having an isotropically-shaped electron emitting surface with approximately equal longitudinal and lateral widths, and thus the electron source 20 allows increase of current values of electron beams to be generated.

The diameter of the cylindrical cathode portion 22 is desirably 500 μm or larger. This is for approximately uniformly increasing the temperature of the electron emitting surface 23 at the tip of the cathode portion 22 when it is heated through the heating unit 26, and for making the electron emitting surface 23 generate electrons approximately evenly. Thereby, the longer-side width of the electron emitting surface 23 is 500 μm or larger, for example.

The shorter-side width of the electron emitting surface 23 is defined based on conditions related to machining of the tip of the cathode portion 22 into a wedge-like form without causing chipping or peeling. In addition, the shorter-side width of the electron emitting surface 23 is desirably wide enough such that the shape of the electron emitting surface 23 can be preserved for a predetermined period even if the tip of the cathode portion 22 is worn off through the process of outputting electrons. The shorter-side width of the electron emitting surface 23 is equal to or smaller than 300 μm, for example. The electron source 20 outputs an electron beam with a current value of 50 mA, for example.

The heating unit 26 sandwiches the side surface of the cylinder from both sides, and physically supports the cathode portion 22. Because of this, the cathode portion 22 having a cylindrical shape may have two portions on the side surface that are cut off. The heating unit 26 may sandwich the cathode portion 22 in the direction along which shorter sides of the electron emitting surface 23 lie. Instead, the heating unit 26 may sandwich the cathode portion 22 in the direction along which longer sides of the electron emitting surface 23 lie. FIGS. 3A to 3C illustrate an example in which the heating unit 26 physically supports the cathode portion 22 by sandwiching the cathode portion 22 in the direction along which shorter sides of the electron emitting surface 23 lie. A current is fed through left and right portions of the heating unit 26 that sandwich the cathode portion 22, thereby causing heat-generation of the heating unit 26, and heating the cathode portion 22.

Figure 4:
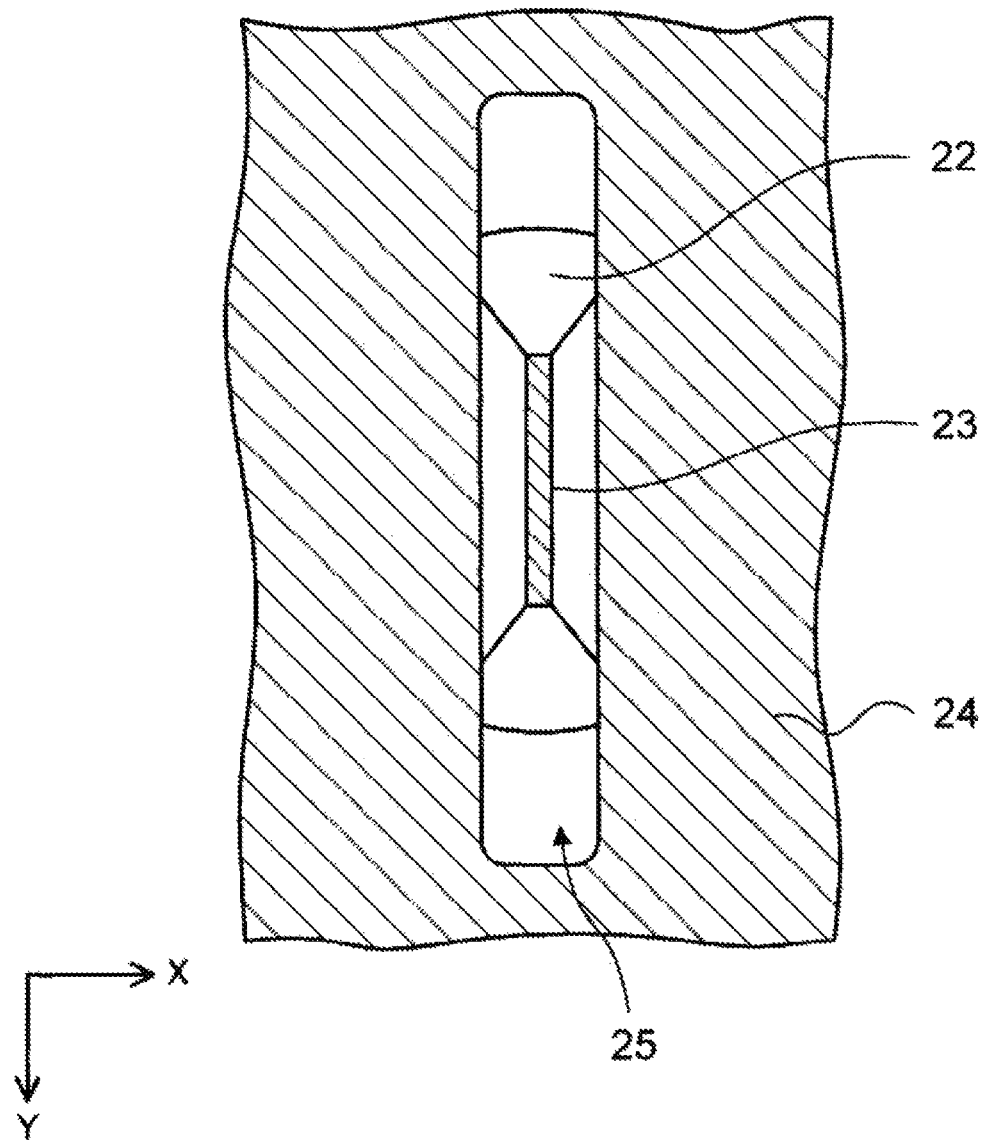
FIG. 4 is a bottom view illustrating a configuration example of the cathode portion 22, the electron emitting surface 23, and a control electrode 24 of the electron source 20 according to the present embodiment.

FIG. 4 is a bottom view of a configuration example of the cathode portion 22, and the control electrode 24 according to the present embodiment, as seen from the output direction of an electron beam. Similar to FIGS. 3A to 3C, the X-axis direction corresponds to the lateral direction of the electron emitting surface 23, the Y-axis direction corresponds to the longitudinal direction of the electron emitting surface 23, and the Z-axis direction corresponds to the output from direction of an electron beam.

An electron generated from the electron emitting surface 23 passes through the opening 25 of the control electrode 24 while being accelerated in the direction out of the sheet of paper. The electron beam passing through the opening 25 is significantly influenced by an electrostatic field of portions of the control electrode 24 that form the lateral ends of the opening 25.

On the other hand, the electron beam passing through the opening 25 is not influenced at all by portions of the control electrode 24 that form the longitudinal ends of the opening 25. This is because the lateral width of the opening 25 is set smaller than its longitudinal width, and the distances between the lateral ends of the opening 25 and the electron beam passing through the opening 25 are smaller than the distances between the longitudinal ends of the opening 25 and the electron beam passing through the opening 25.

Using the control electrode 24 having the anisotropically-shaped opening 25, the electron source 20 controls electrons generated from the anisotropically-shaped electron emitting surface 23 with different longitudinal and lateral widths in mutually orthogonal directions. As compared to the case where electrons are controlled by a control electrode having an isotropically-shaped opening with approximately equal longitudinal and lateral widths, the electron source 20 can effectively control electron beams generated from the entire electron emitting surface 23. Thereby, it becomes possible to utilize generated electrons for an electron beam efficiently.

Figure 5:
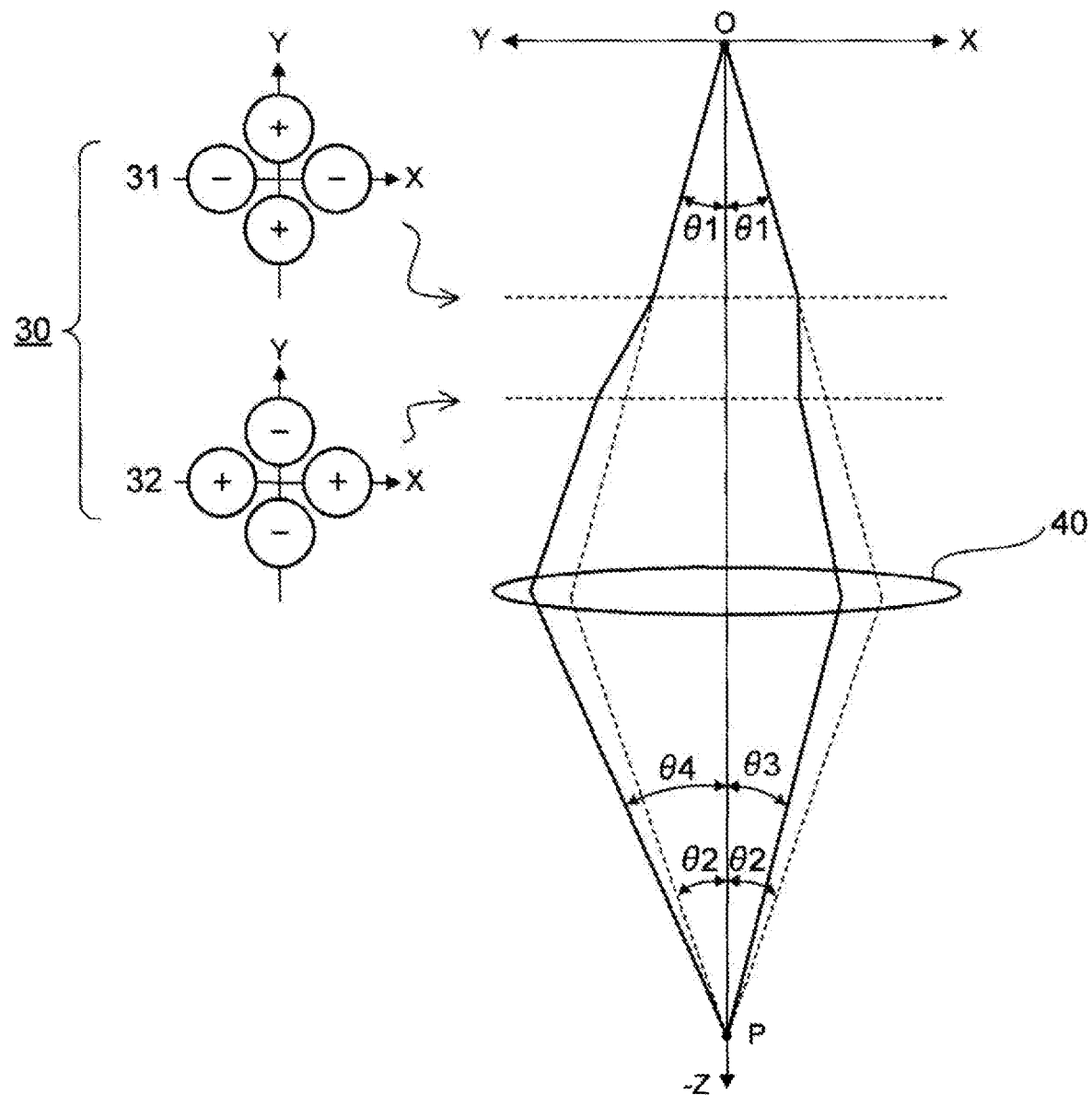
FIG. 5 is a geometrical optics diagram of an electron beam output from the electron source 20.

FIG. 5 is a geometrical optics diagram of an electron beam output from the electron source 20. The figure illustrated to the right of the Z axis drawn in the vertical direction approximately at the middle of FIG. 5 is a geometrical optics diagram of an electron beam on an plane (X-Z plane) formed by the Z-axis direction, which corresponds to the advancing direction of an electron beam, and the X axis, which corresponds to the lateral direction of the electron emitting surface 23. The figure illustrated to the left of the Z axis is a geometrical optics diagram of an electron beam on an plane (Y-Z plane) formed by the Z-axis direction, which corresponds to the advancing direction of an electron beam, and the Y axis, which corresponds to the longitudinal direction of the electron emitting surface 23.

The electromagnetic lens 40 which is symmetrical about the Z axis converges an electron beam that passes therethrough along a path approximately coinciding with the Z axis. The broken lines in FIG. 5 depict a relationship of image-formation by the electromagnetic lens 40 according to an electron beam when the beam shape deforming element 30 is not driven. The electromagnetic lens 40 forms an image of an electron beam having exited from the point O onto the X-Z plane including the lateral direction of the electron emitting surface 23, at the point P on the surface 63 of the powder layer 62. The electromagnetic lens 40 forms an image of an electron beam having exited from the point O onto the Y-Z plane including the longitudinal direction of the electron emitting surface 23, at the point P on the surface 63 of the powder layer 62.

The electromagnetic lens 40 forms an image of the electron emitting surface 23 on the surface 63 of the powder layer 62 at magnifications which are equal for both the X-Z plane and the Y-Z plane. If the broken lines in FIG. 5 indicate that the exit angles $\theta 1$ of an electron beam having exited from the point O onto the X-Z plane and the Y-Z plane are equal, the convergence angles $\theta 2$ of the electron beam at the point P become equal for both the X-Z plane and the Y-Z plane.

Next, the case where the beam shape deforming element 30 is driven is explained. The beam shape deforming element 30 in the illustrated example has electrostatic quadrupole elements 31 and 32 that are arranged at two stages along the Z-axis direction. Each of the electrostatic quadrupole elements 31 and 32 includes two electrodes that generate electric fields that are opposite to each other in the X-axis direction, and two electrodes that generate electric fields that are opposite to each other in the Y-axis direction.

That is, the electrostatic quadrupole elements 31, 32 each include two sets of pole elements that are arranged to be aligned in the same directions as the longitudinal direction, and lateral direction of the electron emitting surface 23 of the electron source 20.

An electron beam passes through the center of the four electrodes in the Z-axis direction. The signs "+" and "−" drawn on the electrodes indicate polarities of voltages applied to those individual electrodes. The electrostatic quadrupole elements 31 and 32 apply voltages with polarities that are different between the X-axis direction electrodes, and the Y-axis direction electrodes to thereby diverge, and converge the opening angle of an electron beam in the X-axis direction, and Y-axis direction, respectively, or converge, and diverge the opening angle in the X-axis direction, and Y-axis direction, respectively. FIG. 5 illustrates an example in which the electrostatic quadrupole elements are arranged such that the electron beam divergence direction, and convergence direction approximately coincide with the X-axis direction, which corresponds to the lateral direction of the electron emitting surface 23 of the electron beam, or the Y-axis direction, which corresponds to its longitudinal direction.

The case where voltages are applied to the electrostatic quadrupole elements with the polarities illustrated in FIG. 5 is explained. When an electron beam having exited from the point O onto the X-Z plane including the lateral direction of the electron emitting surface 23 passes through the electrostatic quadrupole element 31, the electron beam receives a repulsion force from two negative-polarity electrodes arranged along the X-axis direction, and its opening angle starts converging, and when the electron beam passes through the quadrupole element 32, the electron beam receives an attractive force from two positive-polarity electrodes arranged along the X-axis direction, and its opening angle starts diverging.

On the other hand, when an electron beam having exited from the point O onto the Y-Z plane including the longitudinal direction of the electron emitting surface 23 passes through the electrostatic quadrupole element 31, the electron beam receives an attractive force from two positive-polarity electrodes arranged along the Y-axis direction, and its opening angle starts diverging, and when the electron beam passes through the quadrupole element 32, the electron beam receives a repulsion force from two negative-polarity electrodes arranged along the Y-axis direction, and its opening angle starts converging.

An electron beam having exited from the electron emitting surface 23 at the same exit angles $\theta 1$ can be converged at the point P on the surface 63 of the powder layer 62 at different convergence angles $\theta 3$ and $\theta 4$ on the X-Z plane, and the Y-Z plane, respectively, by applying voltages to the electrostatic quadrupole elements. That is, the image on the electron emitting surface 23 can be formed on the surface 63 of the powder layer 62 at magnifications that are different between the X-Z plane and the Y-Z plane.

If the relationship of the convergence angles is O4>O2>O3, the magnification of image-formation on the X-Z plane increases, and the magnification of image-formation on the Y-Z plane decreases. If the relationship of the convergence angles is O3>O2>O4, the magnification of image-formation on the X-Z plane decreases, and the magnification of image-formation on the Y-Z plane increases. That is, by changing the polarities and magnitudes of voltages to be applied to the electrodes in the electrostatic quadrupole elements 31 and 32, it is possible to change the ratio between the longitudinal width and the lateral width of an electron beam imaged on the surface 63 of the powder layer 62, about the lateral direction of the electron emitting surface 23, and the longitudinal direction of the electron emitting surface 23. By utilizing this function, it is possible to change the cross-sectional shape and size of an electron beam without altering the current value of the electron beam. As explained later, this facilitates switching among beam sizes suitable for melting irradiation, outlining irradiation, and preliminary irradiation. In addition, it also becomes possible to perform irradiation while the beam width is being changed, at the time of melting irradiation.

Since such operations for deforming the cross-sectional shape of an electron beam are completed in about several microseconds to several tens microseconds if the electrostatic quadrupole elements 31, 32 of the present embodiment are used, irradiation can be performed while electron beam irradiation conditions are frequently changed.

Because of this, it is also possible to perform melting irradiation for forming a predetermined cross-sectional layer while at the same time a powder layer is being preheated by irradiation using an electron beam that is diffused to such a density that the powder layer is not melted (preliminary irradiation), for example.

Note that the beam shape deforming element 30 may have electrostatic quadrupole elements that are arranged at three stages or more along the Z-axis direction. The electrostatic quadrupole elements arranged at multiple stages separately control the amounts of separation from the Z axis, and the angles formed between the Z axis, and the beam advancing direction for an electron beam having exited onto the X-Z plane and the Y-Z plane. The electrostatic quadrupole elements arranged at multiple stages separately set the convergence angles at which an electron beam exited at the same exit angles onto the X-Z plane and the Y-Z plane converges at the point P. The beam shape deforming element 30 including the electrostatic quadrupole elements arranged at multiple stages forms an image on the electron emitting surface 23, on the surface 63 of the powder layer 62 at magnifications that are different between the X-Z plane, and the Y-Z plane. The beam shape deforming element 30 including the electrostatic quadrupole elements arranged at multiple stages changes the ratio between the longitudinal width and the lateral width (i.e., longitudinal width/lateral width) of an electron beam imaged on the surface 63 of the powder layer 62, about the lateral direction of the electron emitting surface 23, and the longitudinal direction of the electron emitting surface 23.

Figure 6:
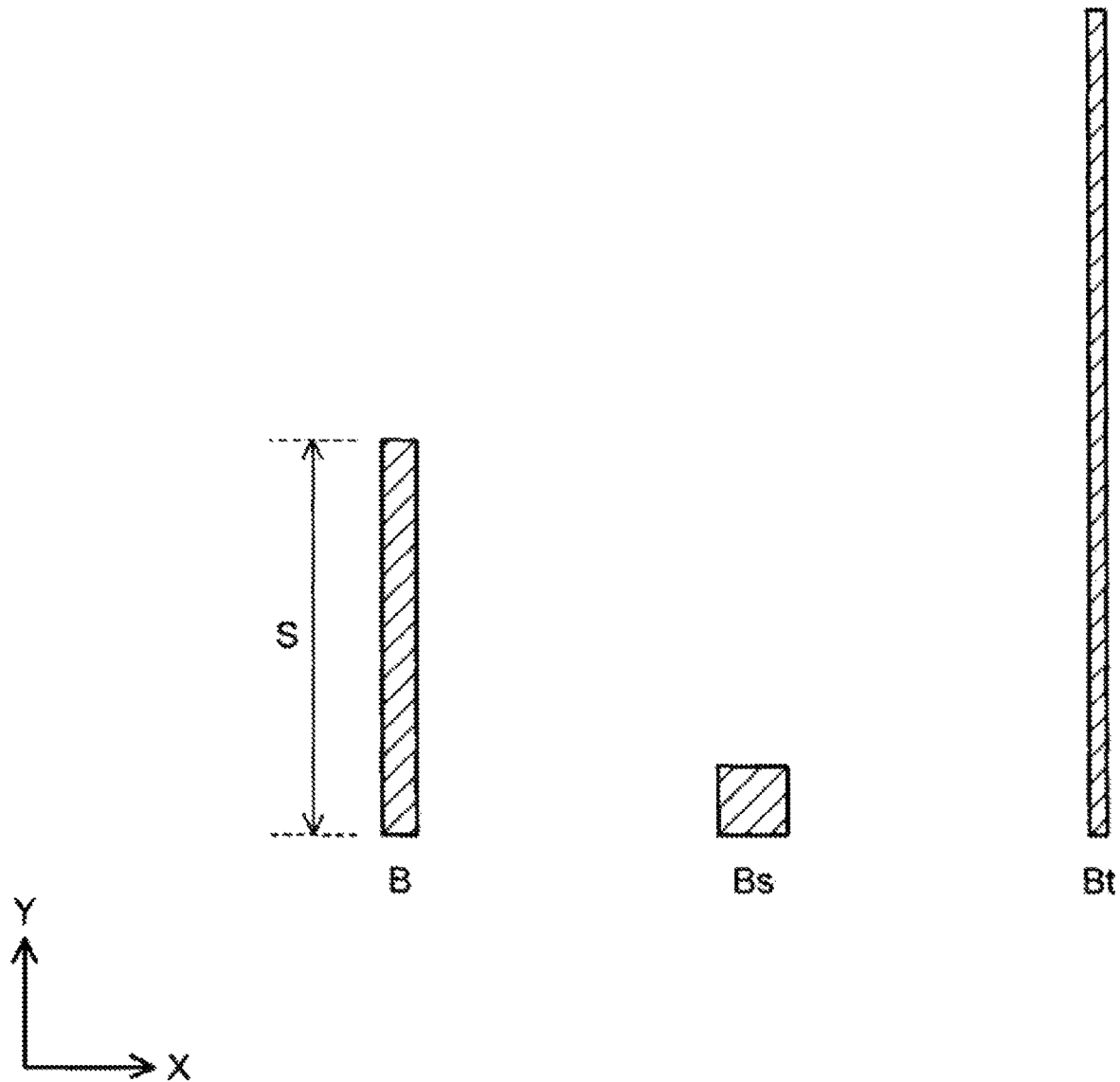
FIG. 6 is a figure illustrating cross-sectional shapes of an electron beam with which a surface of a powder layer is irradiated.

FIG. 6 illustrates exemplary cross-sectional shapes of an electron beam with which the surface 63 of the powder layer 62 is irradiated. The electron beam B illustrated on the left side of FIG. 6 is an exemplary electron beam that is formed by applying predetermined voltages to the electrodes of the electrostatic quadrupole elements 31 and 32 such that the electron beam has a ratio between the longitudinal width and the lateral width that is set to a predetermined magnitude close to the ratio between the longitudinal width and the lateral width of the electron emitting surface 23. The longitudinal beam width S of the electron beam B can be associated with the polarities and magnitudes of voltages applied to the electrodes of the electrostatic quadrupole elements 31 and 32.

The electron beams Bs and Bt illustrated at the middle and on the right side in FIG. 6 are exemplary electron beams that are formed by applying voltages to the electrodes of the electrostatic quadrupole elements 31 and 32, the voltages being set to have polarities and magnitudes that make the ratio between the longitudinal width and the lateral width of the electron beams significantly different from the ratio between the longitudinal width and the lateral width of the electron emitting surface 23. The electron beam Bs is an exemplary electron beam formed to have a narrowed cross-sectional shape with approximately the same lengths in the depth and width directions, with a reduced longitudinal beam width. The electron beam Bt is an exemplary beam formed to have a thin, elongated cross-sectional shape with an increased longitudinal beam width.

Figure 7:
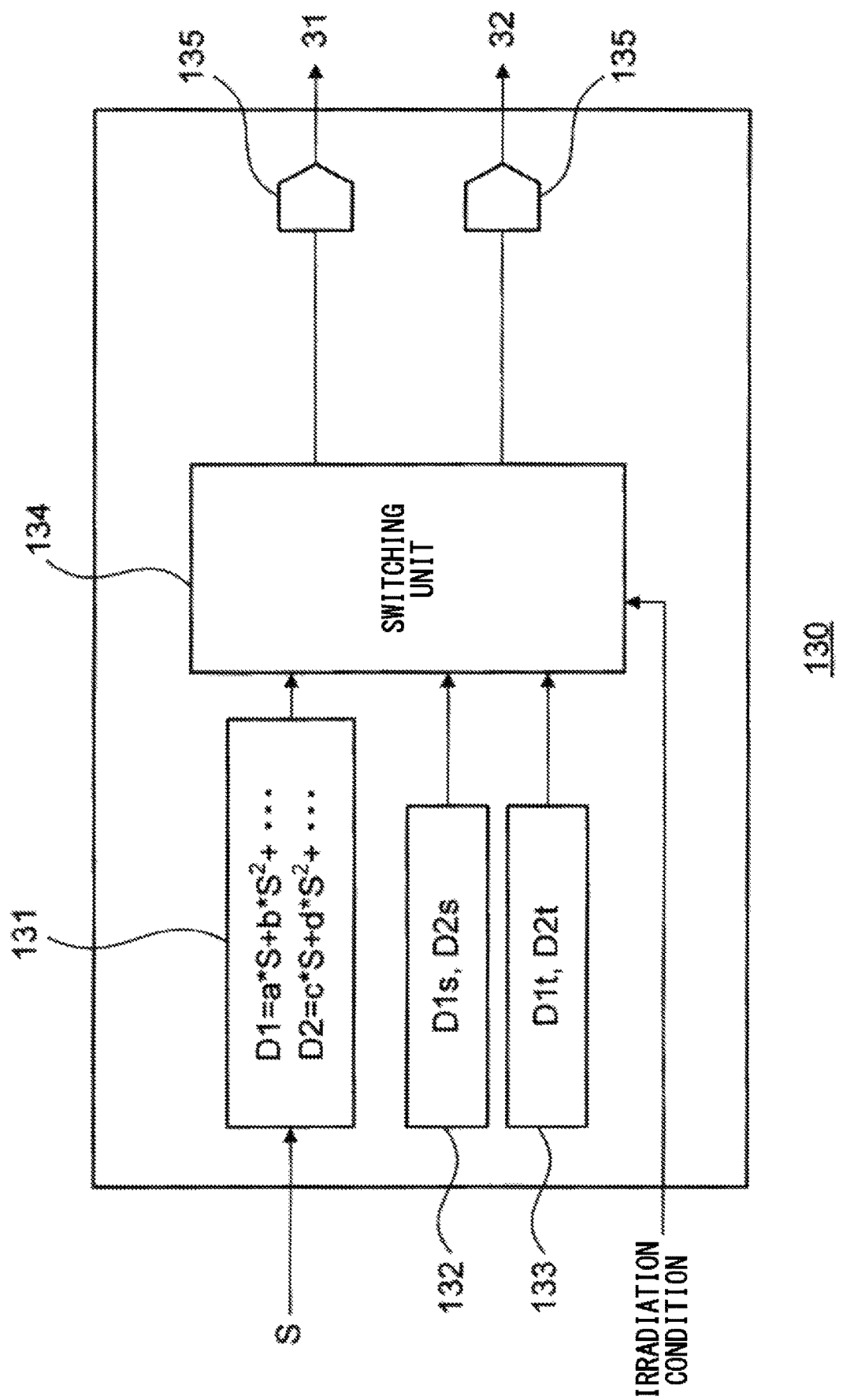
FIG. 7 is a figure illustrating the configuration of a deforming element control unit 130 that controls a beam shape deforming element.

FIG. 7 illustrates a configuration example of the deforming element control unit 130 that controls a beam shape deforming element 30.

A calculating circuit 131 included in the deforming element control unit 130 is a circuit that calculates, based on input data S about a longitudinal beam width, voltage data D1 and D2 to be output to each of the electrostatic quadrupole elements 31 and 32 of the beam shape deforming element 30 for forming the electron beam B having a beam width in the longer-side direction approximately equal to the input data S on the surface 63 of the powder layer 62.

The deforming element control unit 130 may include a calculating circuit that calculates voltage data to be output to each of the electrostatic quadrupole elements 31 and 32 of the beam shape deforming element 30 from input data about beam widths corresponding to the electron beams Bs and Bt in order to form the electron beams Bs and Bt on the surface 63 of the powder layer 62. Instead, the deforming element control unit 130 may measure and store, in advance, voltage data D1s and D2s for the electrostatic quadrupole elements 31 and 32 for forming the electron beam Bs, and voltage data D1t and D2t for the electrostatic quadrupole elements 31 and 32 for forming the electron beam Bt.

A storage circuit 132 included in the deforming element control unit 130 is a circuit that measures and stores, in advance, the voltage data D1s and D2s to be output to each of the electrostatic quadrupole elements 31 and 32 of the beam shape deforming element 30 for forming the electron beam Bs on the surface 63 of the powder layer 62.

In addition, a storage circuit 133 included in the deforming element control unit 130 is a circuit that measures and stores, in advance, the voltage data D1t and D2t to be output to each of the electrostatic quadrupole elements 31 and 32 of the beam shape deforming element 30 for forming the electron beam Bt on the surface 63 of the powder layer 62.

A switching unit 134 included in the deforming element control unit 130 is a circuit that selects voltage data to be output to the electrostatic quadrupole elements 31 and 32 of the beam shape deforming element 30 among values calculated by the calculating circuit 131, values stored in the storage circuit 132, and values stored in the storage circuit 133.

The switching unit 134 selects output from the circuit 131, 132, or 133 to thereby switch the shape of an electron beam imaged on the surface 63 of the powder layer 62 to any one of the shapes illustrated in FIG. 6. The switching unit 134 may switch the shape of an electron beam to be imaged on the surface 63 of the powder layer 62 depending on conditions related to irradiation of the surface 63 of the powder layer 62.

A digital-analog (DA) converting unit 135 included in the deforming element control unit 130 converts, into a voltage value, data output from the circuit 131, 132, or 133 that is selected by the switching unit 134, and outputs the voltage value to the electrodes of the electrostatic quadrupole elements 31 and 32 of the beam shape deforming element 30.

Based on the one electron source 20 having the anisotropically-shaped electron emitting surface 23 with different longitudinal and lateral widths in mutually orthogonal directions, and on the explanations about the accompanying column configuration, and characteristics of electron beams, embodiments of the three-dimensional printing device 100 including the electron beam column 200 having the plurality of electron sources 20 are explained.

The two circles illustrated in FIG. 8 correspond to ranges of the first electron beam, and second electron beam output by the electron beam column 200 having the two electron sources 20 (see FIG. 1) after being deflected by the common deflector 50 in in-plane directions of the surface 63 of the powder layer 62.

The upper limit of the distance by which the deflector 50 deflects the first electron beam, and second electron beam is approximately 150 mm.

The space, in an in-plane direction of an X-Y plane, between the first electron beam and the second electron beam is approximately 30 mm. The two circles on the surface 63 of the powder layer 62 that are irradiated with the first electron beam, and second electron beam have centers that are separated from each other by approximately 30 mm, have diameters of approximately 300 mm, and share a common irradiation portion.

Figure 9A:
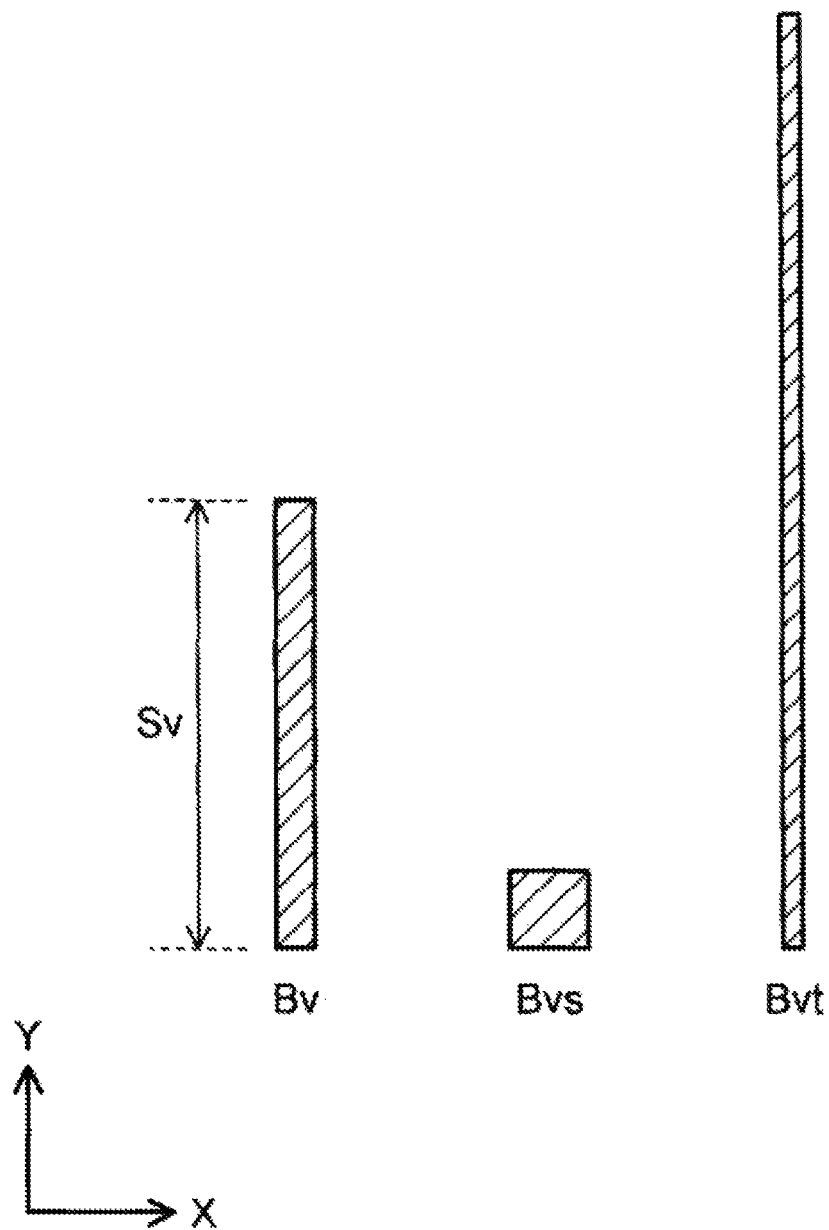
FIG. 9A is a figure illustrating cross-sectional shapes of a first electron beam.
Figure 9B:
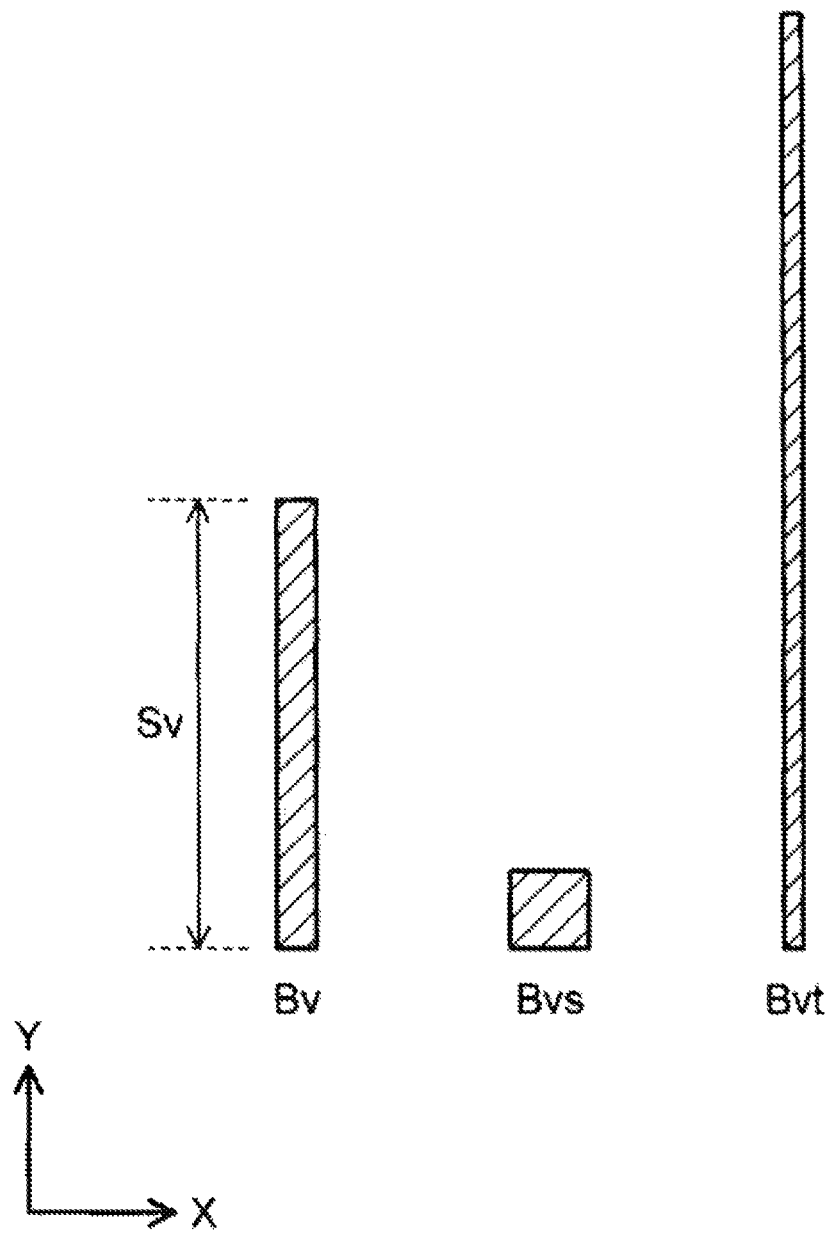
FIG. 9B is a figure illustrating cross-sectional shapes of a second electron beam.

FIG. 9A is a figure illustrating exemplary cross-sectional shapes of the first electron beam with which the surface 63 of the powder layer 62 is irradiated, and FIG. 9B is a figure illustrating cross-sectional shapes of the second electron beam.

Both the first electron beam and the second electron beam are output from the two electron sources 20 having the thin, anisotropically-shaped electron emitting surfaces 23. Both the longitudinal directions of the electron emitting surfaces 23 of the two electron sources 20 are pointing to the Y-axis direction, and the longitudinal directions of the electron emitting surfaces 23 of the two electron sources 20 are approximately parallel to each other.

The beam shape deforming elements 30 that deform the beam shapes of the first electron beam, and second electron beam are controlled independently by the deforming element control unit 130. Because of this, the number of pieces of control output to the beam shape deforming elements 30 by the deforming element control unit 130 illustrated in FIG. 1 depends on the number of the electron sources 20 having the anisotropically-shaped electron emitting surfaces 23.

Accordingly, the first electron beam is deformed to form, on the surface 63 of the powder layer 62: an electron beam By with a longitudinal beam width approximately equal to input data Sv; an electron beam Bvs having a narrowed cross-sectional shape with approximately the same lengths in the depth and width directions; and a beam Bvt having a thin cross-sectional shape elongated in the longitudinal direction. Independently from the first beam, the second electron beam is deformed to form, on the surface 63 of the powder layer 62: an electron beam By with a beam width approximately equal to input data Sv; an electron beam Bvs having a narrowed cross-sectional shape with approximately the same lengths in the depth and width directions; and a beam Bvt having a thin cross-sectional shape elongated in the longitudinal direction.

The two circles illustrated in FIG. 8 on the surface 63 of the powder layer 62 irradiated with these first electron beam, and second electron beam have an overlapping portion.

Figure 10:
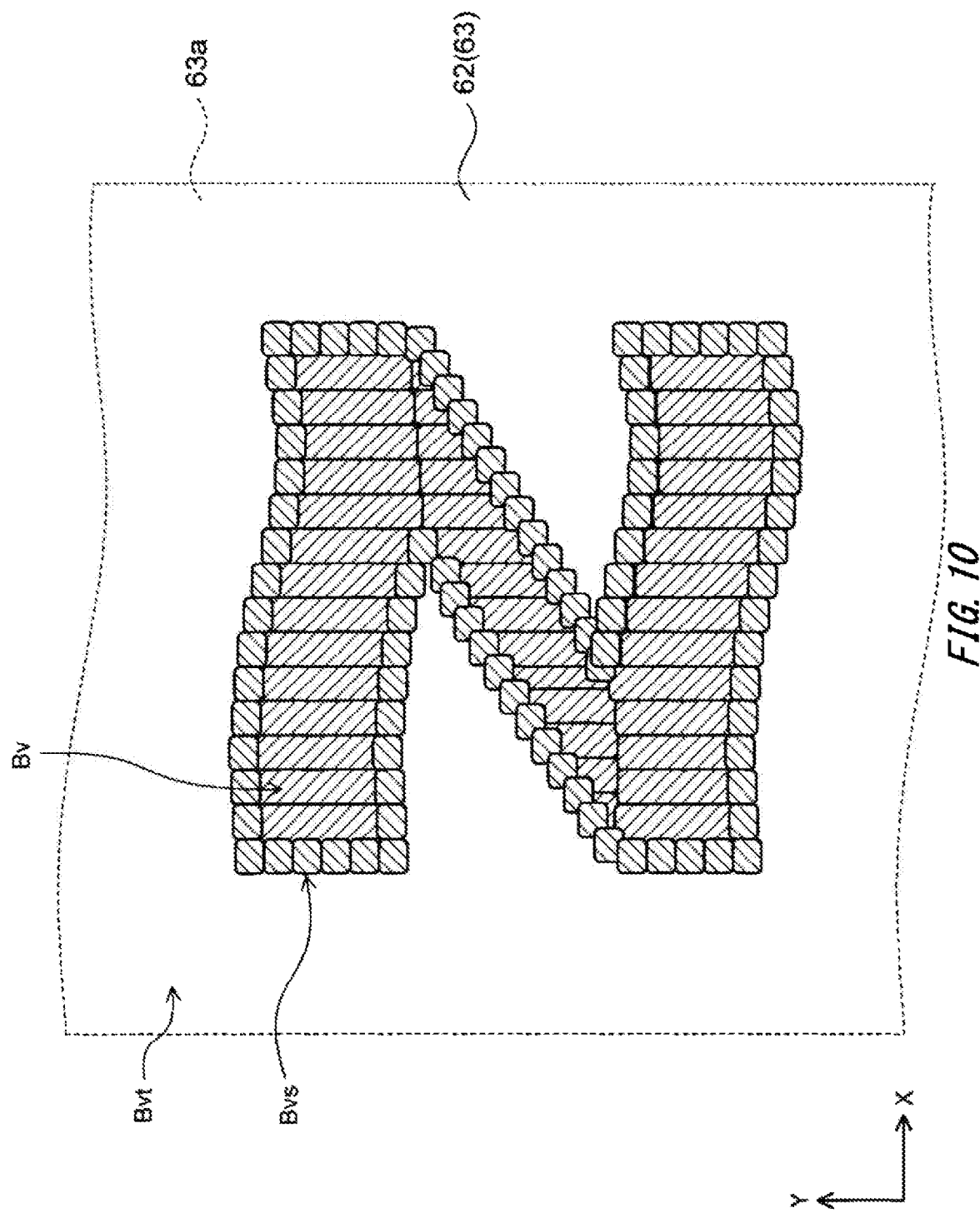
FIG. 10 is a figure illustrating ranges on a surface of a powder layer that are irradiated with electron beams, and electron beams with which the ranges are irradiated.

FIG. 10 illustrates an exemplary range on the surface 63 of the powder layer 62 irradiated with electron beams, and exemplary electron beams with which the range is irradiated. The range of the powder layer 62 that is to be melted and solidified by electron beams is specified as a manufacturing region of a cross-sectional shape that appears after cutting the three-dimensional structure 66 through a plane orthogonal to the direction of the height of the three-dimensional structure 66. In the example illustrated in FIG. 10, the Z-shaped range is a manufacturing region corresponding to the range to be melted and solidified. This manufacturing region is included in a common deflection range of the first beam, and second beam with the diameter of 300 mm on the surface 63 of the powder layer 62.

In the illustrated example, the three-dimensional printing device 100 deforms electron beams into the beam By having an appropriate beam width Sv, and scans all over the Z-shaped range on the surface 63 of the powder layer 62 at a predetermined beam movement speed to thereby melt the powder layer 62 in the range. In addition, the three-dimensional printing device 100 deforms electron beams into the beam Bvs having a narrowed cross-sectional shape with approximately equal depth and width, and performs outlining scanning on the periphery of the Z-shaped range at another predetermined beam movement speed to thereby melt the periphery of the Z-shaped range of the powder layer 62.

Other than the above-mentioned beam irradiation for melting and solidifying the powder layer 62, and beam irradiation for outlining, the three-dimensional printing device 100 performs preliminary irradiation of irradiating a larger range including a melting-target range on the surface 63 of the powder layer 62 with electron beams at low irradiation densities. Here, an irradiation density represents an amount of an electron beam with which a per unit area on the surface 63 of the powder layer 62 is irradiated.

In the example illustrated in FIG. 10, the range indicated by broken lines is a preliminary irradiation region 63a on which preliminary irradiation is performed.

The three-dimensional printing device 100 uses the beam Bvt that is thin and elongated in the longitudinal direction for preliminary irradiation. Even if the Z-shaped manufacturing region illustrated in the example of FIG. 10 is scanned with beams under the same conditions as those for melting irradiation using the beam By or beam Bvs, a range larger than the manufacturing region is irradiated with beams at low irradiation densities since the beam Bvt has an elongated cross-section. Although the beam Bvt has a total beam current value which is approximately the same as that of the beam By or beam Bvs, temperature increase of the powder layer 62 can be suppressed since the range irradiated under the same scanning conditions is larger. Thereby, the beam Bvt can preheat the powder layer 62 to a temperature equal to or lower than its melting point.

By appropriately setting the longitudinal length of the beam Bvt with a thin cross-sectional shape, the three-dimensional printing device 100 can set an irradiation amount for performing preliminary irradiation on a larger range including the manufacturing region which is part of the surface 63 of the powder layer 62 under the same scanning condition as those for melting irradiation using the beam By or beam Bvs on the manufacturing region.

The preliminary irradiation may be performed simultaneously with beam irradiation for melting, or may be performed prior to beam irradiation for melting. The preliminary irradiation is performed for facilitating melting by melting irradiation by heating (preheating) the powder layer 62 including the manufacturing region to a temperature slightly lower than the melting point of powders, and for reducing distortion of a manufactured object generated due to temperature gradient.

In addition, the preliminary irradiation can suppress dispersion of raw material powders constituting the powder layer 62 that can occur otherwise due to beam irradiation, and moreover can suppress charge-up by giving preliminary electric charges (giving electric charges).

Figure 11:
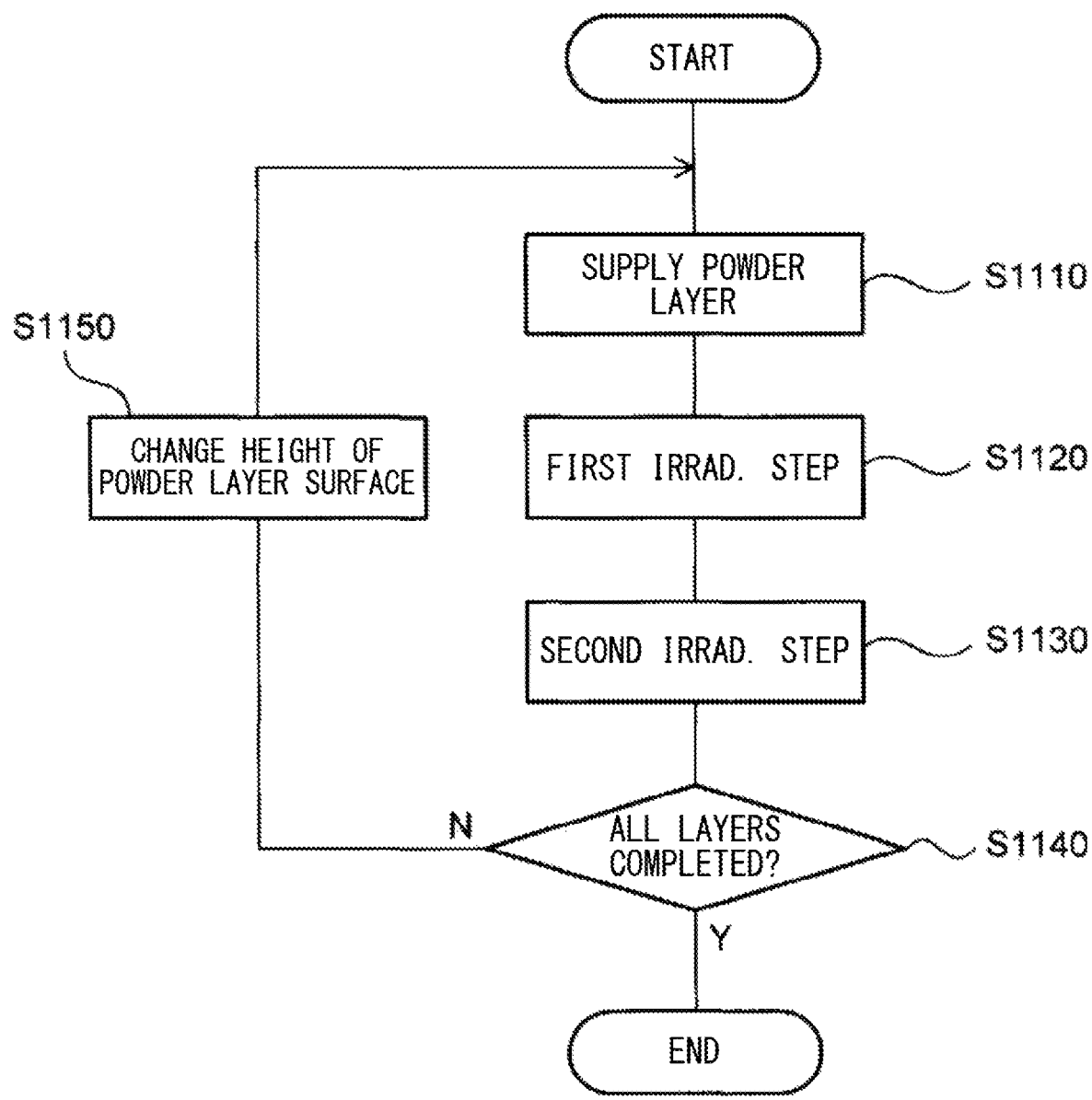
FIG. 11 is a flowchart illustrating a printing operation of the three-dimensional printing device 100.

FIG. 11 illustrates an exemplary flow of operations illustrating printing operations of the three-dimensional printing device 100. If the printing operations are started, the three-dimensional printing device 100 supplies the powder sample 68 from the sample supply unit 64 of the manufacturing unit 300, and supplies the powder layer 62 flattened to be approximately parallel with the bottom surface portion 72 surrounded by the side wall portion 74 (S1110).

The three-dimensional printing device 100 irradiates the surface 63 of the powder layer 62 with electron beams output from the electron beam column 200. The step of irradiating the surface 63 of the powder layer 62 with electron beams is performed at two separate steps which are a first irradiation step (S1120), and a second irradiation step (S1130). An exemplary flow of operations performed by the three-dimensional printing device 100 at the first irradiation step (S1120), and the second irradiation step (S1130) is explained later. By performing the irradiation steps, the three-dimensional printing device 100 melts and solidifies a predetermined range of the powder layer 62, and forms the cross-section layer 65 to be part of the three-dimensional structure 66.

Next, the three-dimensional printing device 100 determines whether layering of all the cross-section layers 65 to constitute the three-dimensional structure 66 has been completed (S1140). If layering of all the layers has not been completed (S1140; No), the three-dimensional printing device 100 manipulates the driving unit 82, and driving rod 84, drives the bottom surface portion 72 in the Z-axis direction, and lowers the height of the surface 63 of the melted and solidified powder layer 62 (S1150). The three-dimensional printing device 100 returns to the step of supplying an amount of a powder layer 62 corresponding to the lowered amount of the height of the surface 63 of the powder layer 62 (S1110). If layering of all the layers has been completed (S1140; Yes), the three-dimensional printing device 100 ends the printing operations.

Figure 12:
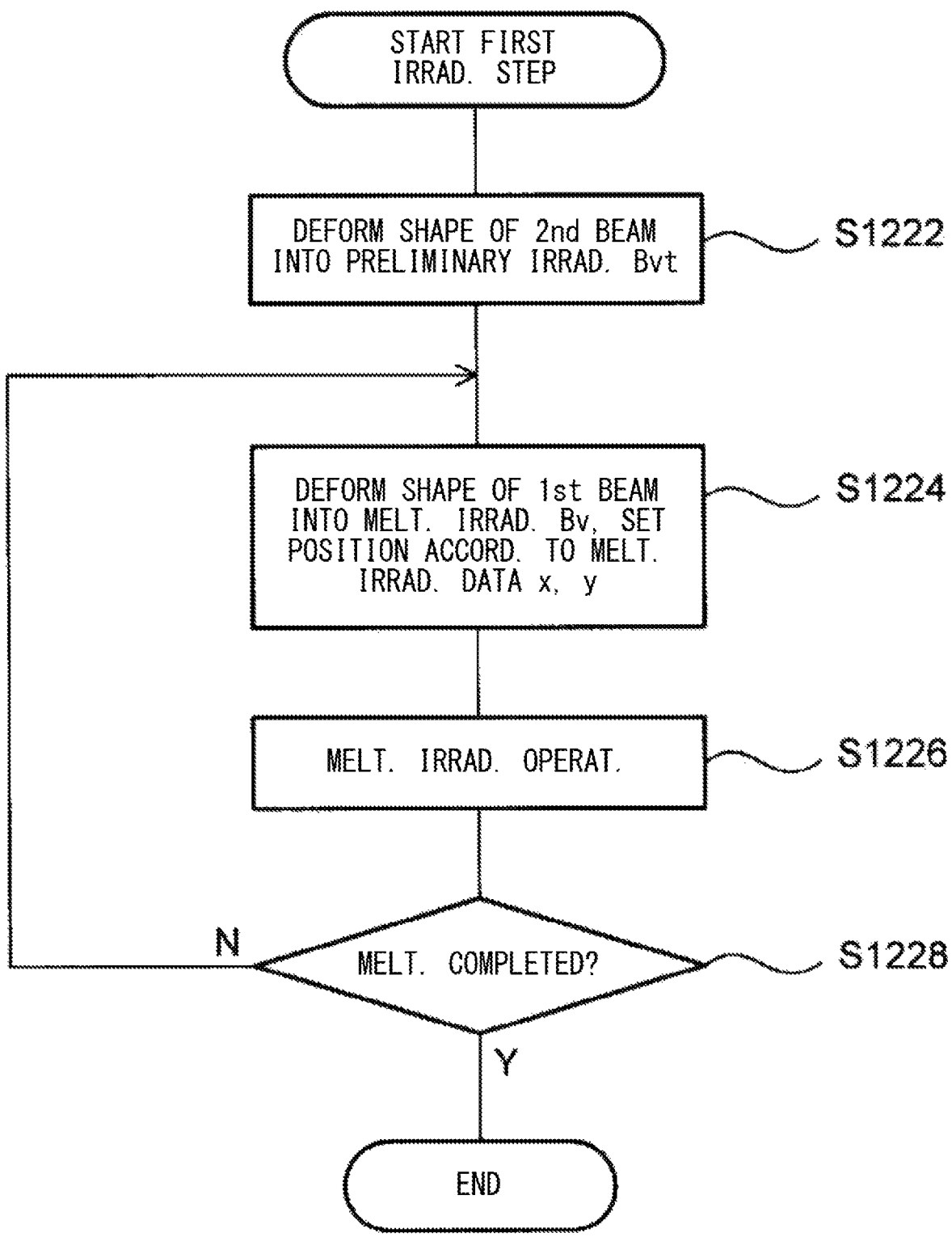
FIG. 12 is a flowchart of a first irradiation step of the three-dimensional printing device 100.
Figure 13:
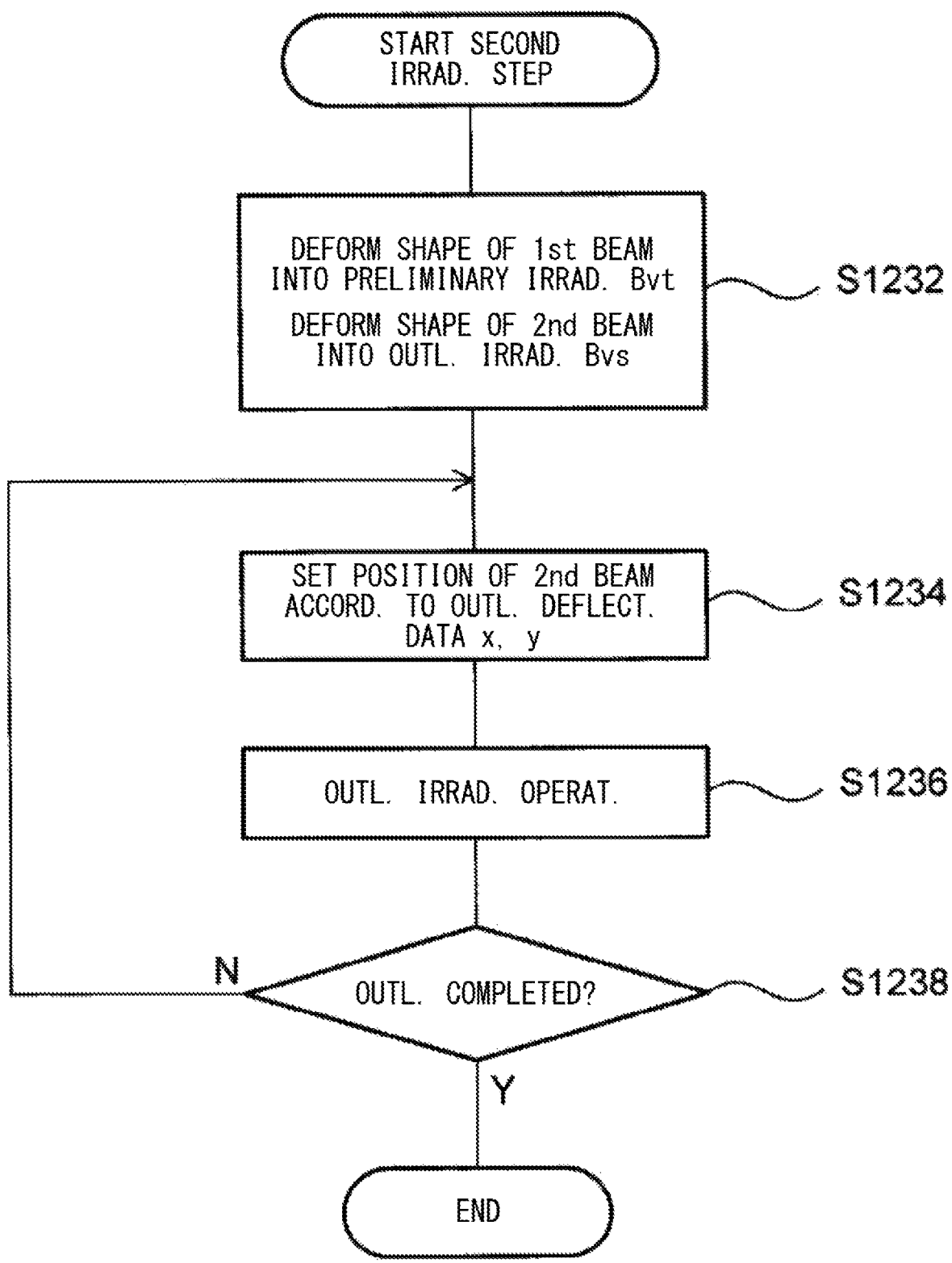
FIG. 13 is a flowchart of a second irradiation step of the three-dimensional printing device 100.

FIG. 12 and FIG. 13 illustrate exemplary flows of operations of the first irradiation step (S1120), and the second irradiation step (S1130) in which the three-dimensional printing device 100 irradiates the surface 63 of the powder layer 62 with electron beams output from the electron beam column 200. FIG. 12 and FIG. 13 correspond to the first irradiation step (S1120), and the second irradiation step (S1130), respectively.

If the first irradiation step (S1222 to 1228) illustrated in FIG. 12 is started, the three-dimensional printing device 100 changes the setting of a shape deforming element 30 for one of two electron beams (e.g., the second electron beam) such that the beam is deformed into the beam Bvt for preliminary irradiation. The setting for the second electron beam is changed such that the second electron beam is to be output as the beam Bvt until the first irradiation step ends (S1222).

The three-dimensional printing device 100 changes the setting about output from the calculating circuit 131 illustrated in FIG. 7 such that a shape deforming element 30 for the other of the two electron beams (e.g., the first electron beam) deforms the beam into the beam By having a longitudinal beam width which equals the predetermined beam width Sv (S1224).

In addition, the three-dimensional printing device 100 changes the setting of the common deflector 50 for the first electron beam, and second electron beam such that the first electron beam is deflected to the deflection position (x, y) for melting irradiation (S1224). The beam width Sv of the first electron beam, and the deflection position (x, y) for melting irradiation are decided based on manufacturing data representing the shape of a melting-target portion (manufacturing region) on the surface 63 of the powder layer 62.

The three-dimensional printing device 100 performs melting irradiation using the first electron beam (S1226). At this time, the second electron beam has been deflected to the deflection position (x, y) for the second beam by the common deflector 50, and preliminary irradiation using the second electron beam is performed simultaneously with the melting irradiation using the first electron beam.

A position irradiated with the second electron beam is apart from a position irradiated with the first electron beam by the space between the electron beams (e.g., 30 mm). Since the deflection position of the second electron beam is set in association with the deflection position (x, y) of the first electron beam used in melting irradiation, a region on which preliminary irradiation is performed using the second electron beam approximately overlaps the range of the powder layer 62 irradiated with the first electron beam.

The three-dimensional printing device 100 determines whether melting irradiation on the surface 63 of the powder layer 62 has been completed (S1228). If the melting irradiation has not been completed (S1228; No), the three-dimensional printing device 100 sets values of the beam width Sv, and the deflection position (x, y) for the next melting irradiation in the shape deforming element 30 for the first electron beam, and the deflector 50 (S1224), and performs melting irradiation using the first electron beam (S1226). The melting irradiation using the first electron beam, and the preliminary irradiation using the second electron beam proceed simultaneously. If the melting irradiation on a melting-target portion on the surface 63 of the powder layer 62 has been completed (S1228; Yes), the three-dimensional printing device 100 ends the first irradiation step (S1222 to 1228).

In the irradiation operations at the above-mentioned Steps S1224 to S1228, the first electron beam repetitively stays at set deflection position (x, y) for a certain length of time, and then moves to the next deflection position. During the operations, the longitudinal beam width of the first electron beam is altered appropriately depending on the shape of a pattern like the oblique portion in the illustrated Z-shaped pattern, for example.

In the present embodiment, since the electrostatic quadrupole elements are used for the beam shape deforming elements 30, the length of time required for alteration of beam widths is as short as several microseconds to several tens microseconds, and so the processing speed is unlikely to lower even if alteration of the beam widths at Step S1224 occurs frequently.

If the second irradiation step (S1232 to 1238) illustrated in FIG. 13 is started following the first irradiation step, the three-dimensional printing device 100 changes the setting of a shape deforming element 30 for one of two electron beams (the first electron beam) such that the beam is deformed into the beam Bvt for preliminary irradiation.

In addition, the three-dimensional printing device 100 sets a shape deforming element 30 for the other of the two electron beams (the second electron beam) such that the beam is deformed into the beam Bvs for outlining irradiation. The setting for the first electron beam, and second electron beam are changed such that the first electron beam, and second electron beam are to be output as the beam Bvt, and beam Bvs, respectively, until the second irradiation step ends (S1232).

The three-dimensional printing device 100 changes the setting of the common deflector 50 for the first electron beam, and second electron beam such that the second electron beam is deflected to the deflection position (x, y) for outlining (S1234).

The three-dimensional printing device 100 performs outlining irradiation using the second electron beam (S1236). At this time, the first electron beam has been deflected to the deflection position (x, y) for the first beam by the common deflector 50, and preliminary irradiation using the first electron beam is performed simultaneously with the outlining irradiation using the second electron beam.

A position irradiated with the first electron beam is apart from a position irradiated with the second electron beam by the space between the electron beams (e.g., 30 mm). Since the deflection position of the first electron beam is set in association with the deflection position (x, y) of the second electron beam used in outlining irradiation, a region on which preliminary irradiation is performed using the first electron beam approximately overlaps the range of the powder layer 62 that undergoes outlining irradiation using the second beam.

The three-dimensional printing device 100 determines whether outlining of the melting-target portion on the surface 63 of the powder layer 62 has been completed (S1238). If the outlining has not been completed (S1238; No), the three-dimensional printing device 100 sets values for the next portion to undergo outlining using the second electron beam in the common deflector 50 for the first electron beam, and second electron beam (S1234), and performs outlining irradiation using the second electron beam (S1236). The preliminary irradiation using the first electron beam, and outlining irradiation using the second electron beam proceed simultaneously by means of the common deflector 50. If the outlining of the melting-target portion on the surface 63 of the powder layer 62 has been completed (S1238; Yes), the three-dimensional printing device 100 ends the second irradiation step (S1132 to 1138).

In the above-mentioned outlining irradiation at Steps S1232 to S1238, the edge of a manufacturing region is irradiated with the second electron beam having a narrowed cross-sectional shape. Since irradiation using a narrowed electron beam performed in this manner generates a temperature gradient that is steeper than that generated at the time of melting irradiation, a melted layer with a sharp outline can be formed, and so the roughness of the surface of a finished manufactured object can be lowered, and the accuracy improves.

At the steps illustrated in FIG. 12 and FIG. 13, the three-dimensional printing device 100 according to the embodiment changes the voltages to be applied to the electrostatic quadrupole electrodes constituting the beam shape deforming elements 30 to thereby deform the shapes of the first electron beam, and second electron beam into the electron beams By, Bvs, and Bvt suited for melting irradiation, outlining irradiation, and preliminary irradiation, respectively. Since simply the beam shapes are deformed by setting voltages for the electrodes of the electrostatic quadrupole elements, the three-dimensional printing device 100 can set the states of the electron beams at each instance of irradiation stably and with good reproducibility as compared to the case where operation conditions of the electron sources 20 are altered to set irradiation conditions, for example.

The three-dimensional printing device 100 according to the embodiment irradiates approximately the same ranges on the surface 63 of the powder layer 62 with the first electron beam, and second electron beam simultaneously at different irradiation conditions such as (i) melting irradiation, and preliminary irradiation, or (ii) outlining irradiation, and preliminary irradiation. Thereby, the three-dimensional printing device 100 allows reduction of time for the entire irradiation steps as compared to the case where melting irradiation, outlining irradiation, and preliminary irradiation are performed separately.

In addition, the three-dimensional printing device 100 according to the embodiment keeps outputting the first electron beam, and second electron beam deformed to the electron beam By, Bvs, or Bvt suited for melting irradiation, outlining irradiation, or preliminary irradiation without changing the setting while the steps of performing melting irradiation and outlining irradiation illustrated in the loops in FIG. 12 and FIG. 13 are being performed. Thereby, the three-dimensional printing device 100 can omit switching of the current values of the electron beams during the irradiation steps, or can omit waiting time that is otherwise required until the beam states are stabilized after the sizes of electron beams are significantly altered.

Note that in the example illustrated in FIG. 12, and FIG. 13, the first irradiation step is performed using the first electron beam for melting irradiation, and using the second electron beam for preliminary irradiation, and the second irradiation step is performed using the first electron beam for preliminary irradiation, and using the second electron beam for outlining irradiation. Instead, the first irradiation step may be performed using the first electron beam for preliminary irradiation, and using the second electron beam for melting irradiation, and the second irradiation step may be performed using the first electron beam for outlining irradiation, and using the second electron beam for preliminary irradiation.

In addition, in the example illustrated in FIG. 12, and FIG. 13, melting irradiation, and preliminary irradiation are performed at the first irradiation step, and after that, outlining irradiation, and preliminary irradiation are performed at the second irradiation step. Instead, outlining irradiation, and preliminary irradiation may be performed at the first irradiation step, and after that, melting irradiation, and preliminary irradiation may be performed at the second irradiation step.

Furthermore, in the example illustrated in FIG. 12, and FIG. 13, preliminary irradiation is performed at both the first irradiation step, and the second irradiation step. The three-dimensional printing device 100 may perform preliminary irradiation only one of the first irradiation step and the second irradiation step by selecting the beam Bvt so as to give an irradiation amount necessary for the preliminary irradiation at one of the first irradiation step and the second irradiation step.

Second Embodiment

A configuration example of the three-dimensional printing device 100 according to a second embodiment is explained. The three-dimensional printing device 100 according to the second embodiment includes at least two electron sources 20 having anisotropically-shaped electron emitting surfaces 23 with different longitudinal and lateral widths in mutually orthogonal directions. The longitudinal direction of an electron emitting surface 23 of one of the two electron sources 20, the electron source 20, points to the Y-axis direction, and the longitudinal direction of an electron emitting surface 23 of the other electron source 20 points to the X-axis direction. That is, the longitudinal directions of the electron emitting surfaces of the two electron sources are approximately orthogonal to each other. In addition, a beam shape deforming element 30 is constituted with electrostatic quadrupole elements having divergence directions and convergence directions approximately coinciding with the longitudinal or lateral direction of an anisotropically-shaped electron emitting surface 23 of an electron source 20 that outputs one of electron beams.

The three-dimensional printing device 100 according to the second embodiment has a configuration equivalent to that illustrated in FIG. 1 in other respects. Portions that have functions which are approximately the same as those of the device configurations or device operations explained already are explained using the same symbols.

Figure 14A:
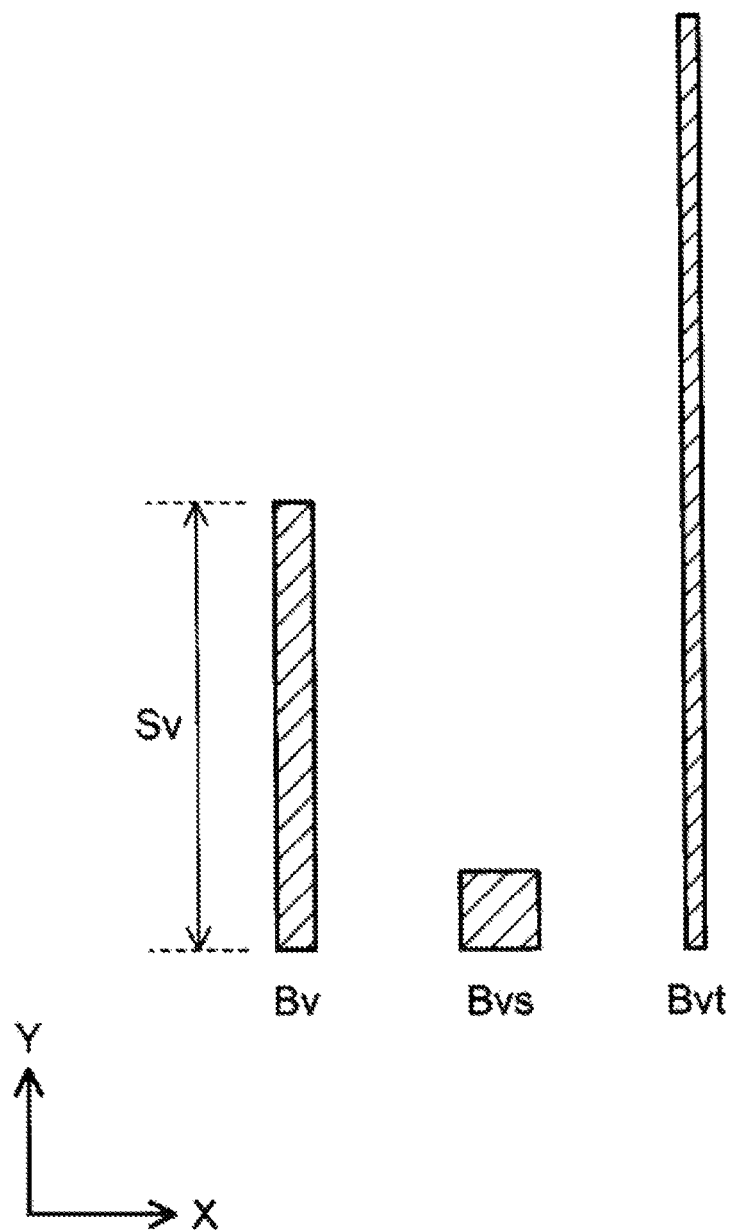
FIG. 14A is a figure illustrating cross-sectional shapes of a first electron beam of the three-dimensional printing device 100 according to a second embodiment.
Figure 14B:
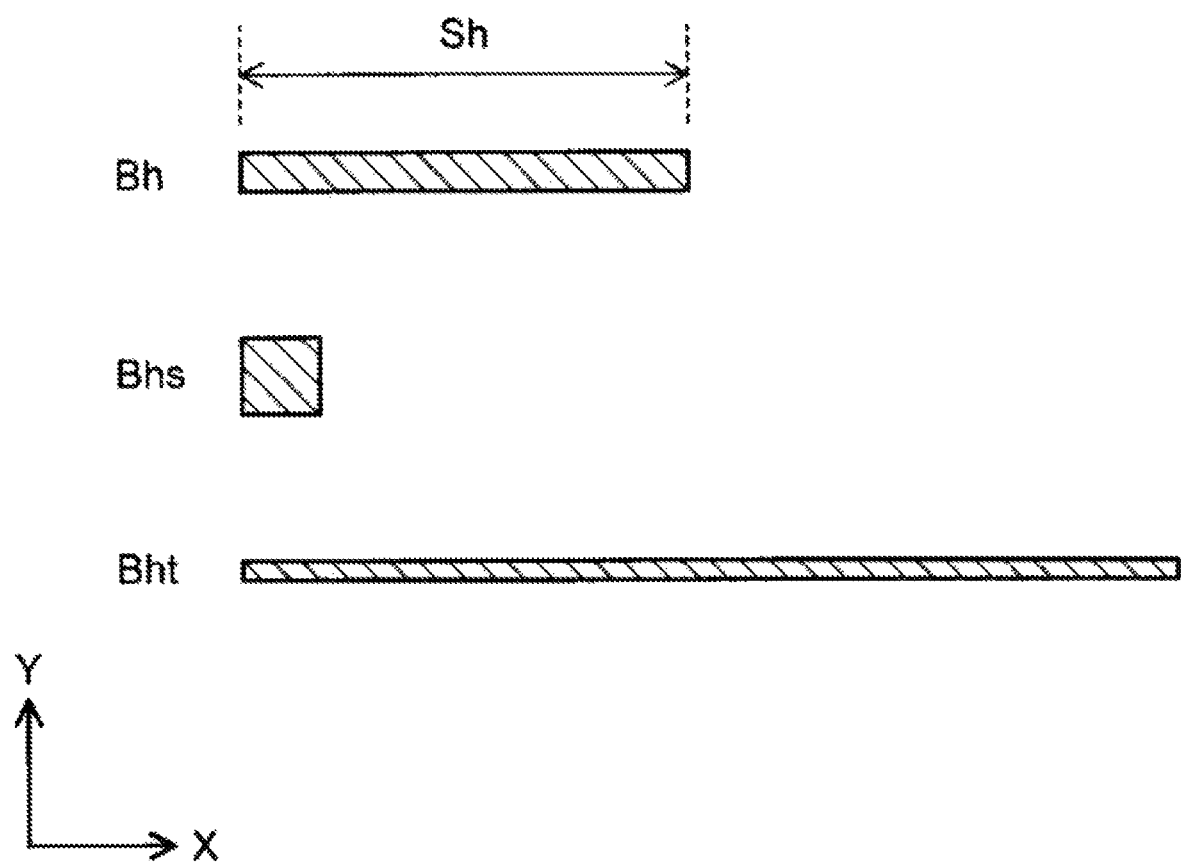
FIG. 14B is a figure illustrating cross-sectional shapes of a second electron beam of the three-dimensional printing device 100 according to the second embodiment.

FIG. 14A, and FIG. 14B correspond to FIG. 9A, and FIG. 9B explained already, and illustrate exemplary beam shapes of the first electron beam, and second electron beam of the three-dimensional printing device 100 according to the second embodiment. The first electron beam is deformed by a beam shape deforming element 30 into: an electron beam By with a beam width in the Y-axis direction approximately equal to input data Sv; an electron beam Bvs having a narrowed cross-sectional shape with approximately the same lengths in the depth and width directions; and a beam Bvt that is thin and elongated in the Y-axis direction.

Independently from the first beam, the second electron beam is deformed by a beam shape deforming element 30 into: an electron beam Bh with a beam width in the X-axis direction approximately equal to input data Sh; an electron beam Bhs having a narrowed cross-sectional shape with approximately the same lengths in the depth and width directions; and a beam Bht having a thin cross-sectional shape elongated in the X-axis direction.

Figure 15:
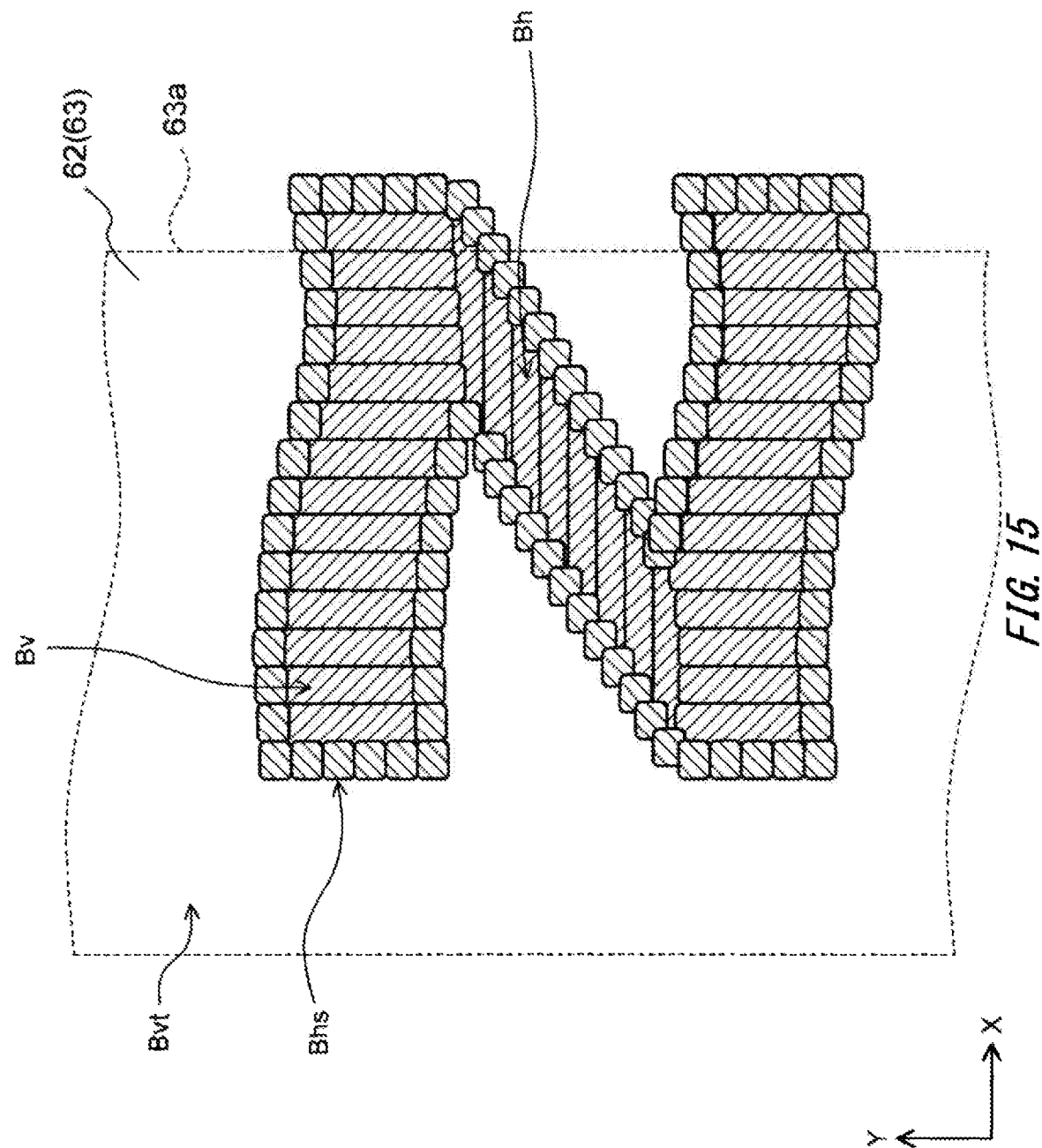
FIG. 15 is a figure illustrating ranges on a surface of a powder layer that are irradiated with electron beams, and the electron beams with which the ranges are irradiated, in the three-dimensional printing device 100 according to the second embodiment.

FIG. 15 corresponds to FIG. 10 explained already, and illustrates an exemplary range on the surface 63 of the powder layer 62 irradiated with electron beams, and exemplary electron beams with which the range is irradiated, in the three-dimensional printing device 100 according to the second embodiment. In the example illustrated in FIG. 15 also, the Z-shaped range corresponds to a manufacturing region to be melted and solidified.

In the example illustrated in FIG. 15, the three-dimensional printing device 100 deforms the first electron beam into the beam By, deforms the second electron beam into the beam Bh, and scans all over the Z-shaped range on the surface 63 of the powder layer 62 at a predetermined beam movement speed to thereby melt the powder layer 62 in the range. In addition, in the example illustrated in FIG. 15, the three-dimensional printing device 100 performs outlining scanning using the electron beam Bhs on the periphery of the Z-shaped range at another predetermined beam movement speed to thereby melt the periphery of the Z-shaped range of the powder layer 62.

The three-dimensional printing device 100 uses the beam Bvt that is thin and elongated in the Y-axis direction for preliminary irradiation. The region 63a to undergo preliminary irradiation is indicated by broken lines. The positional relationship between the preliminary irradiation region 63a indicated by the broken lines, and the Z-shaped melted and solidified range is illustrated slightly differently between FIG. 15 and FIG. 10. This is because, while in the example illustrated in FIG. 10, both the first electron beam and the second electron beam are used for preliminary irradiation, in the example illustrated in FIG. 15, only the first electron beam is used for preliminary irradiation, for example.

Figure 16:
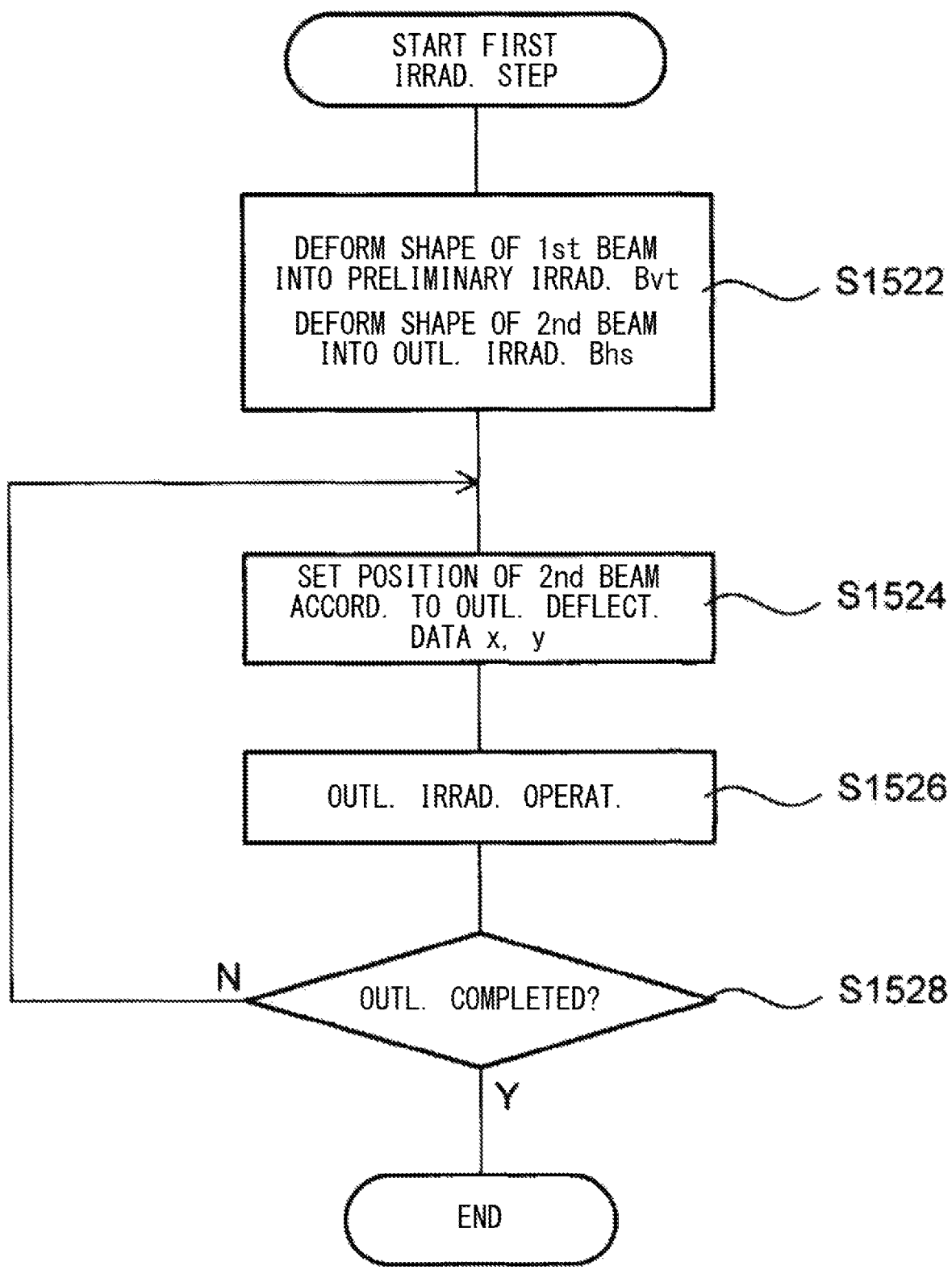
FIG. 16 is a flowchart of a first irradiation step of the three-dimensional printing device 100 according to the second embodiment.
Figure 17:
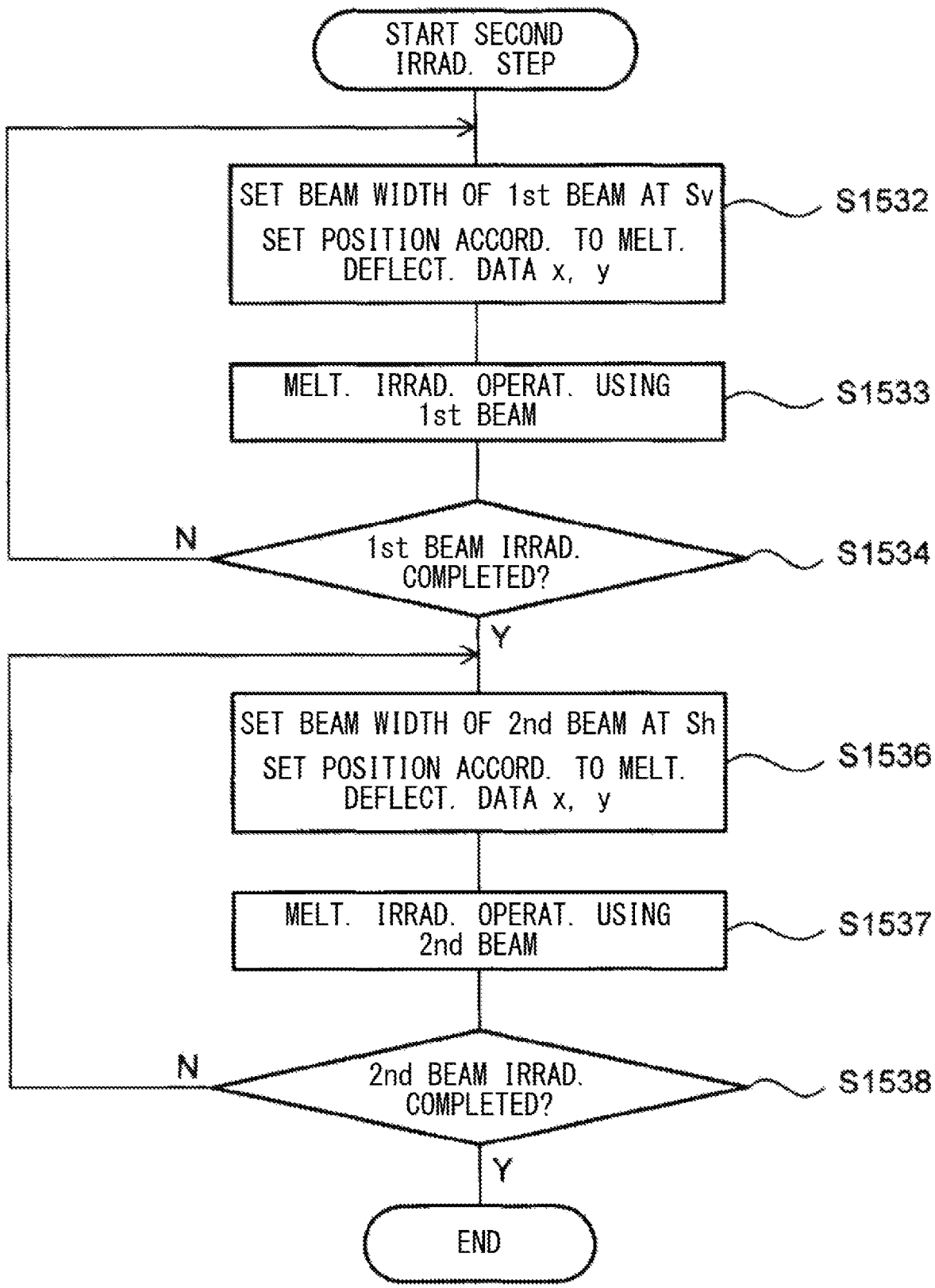
FIG. 17 is a flowchart of a second irradiation step of the three-dimensional printing device 100 according to the second embodiment.

FIG. 16, and FIG. 17 correspond to FIG. 12, and FIG. 13 explained already, and illustrate exemplary flows of operations of the first irradiation step, and the second irradiation step of the three-dimensional printing device 100 according to the second embodiment. Steps that are occupied by the first irradiation step (S1120), and the second irradiation step (S1130) in the entire operation flow of the device are indicated as Steps S1120, 1130 in FIG. 11.

If the first irradiation step (S1522 to S1528) illustrated in FIG. 16 is started, the three-dimensional printing device 100 deforms one of the two electron beams (e.g., the first electron beam) into the beam Bvt for preliminary irradiation with a shape deforming element 30 for the electron beam, and deforms the other beam (e.g., the second electron beam) into the beam Bhs for outlining with a shape deforming element 30 for the electron beam. The setting for the first electron beam, and second electron beam are changed such that the first electron beam, and second electron beam are to be output as the beams Bvt, and Bhs, respectively, until the first irradiation step ends (S1522).

The three-dimensional printing device 100 changes the setting of the common deflector 50 for the first electron beam, and second electron beam such that the second electron beam is deflected to the deflection position (x, y) for outlining (S1524). The three-dimensional printing device 100 performs outlining irradiation using the second electron beam (S1526). At this time, the preliminary irradiation using the first electron beam, and the outlining irradiation using the second electron beam proceed simultaneously. The three-dimensional printing device 100 determines whether outlining of the melting-target portion on the surface 63 of the powder layer 62 has been completed (S1528).

If the outlining has not been completed (S1528; No), the three-dimensional printing device 100 sets values for the next portion to undergo outlining using the second electron beam in the common deflector 50 for the first electron beam, and second electron beam (S1524), and performs outlining irradiation using the second electron beam (S1526). If the outlining of the melting-target portion on the surface 63 of the powder layer 62 has been completed (S1528; Yes), the three-dimensional printing device 100 ends the first irradiation step (S1120).

If the second irradiation step (S1120) illustrated in FIG. 17 is started, the three-dimensional printing device 100 changes the setting about output from the calculating circuit 131 illustrated in FIG. 7 such that the beam width of one of the two electron beams (e.g., the first electron beam) in the Y-axis direction becomes the predetermined beam width Sv of the beam By (S1532).

In addition, the three-dimensional printing device 100 changes the setting of the common deflector 50 for the first electron beam, and second electron beam such that the first electron beam is deflected to the deflection position (x, y) for melting irradiation (S1532). The three-dimensional printing device 100 performs melting irradiation using the first electron beam (S1533). At this time, a value with which the second electron beam does not reach the surface 63 of the powder layer 62 is set in the beam shape deforming element 30 for the second electron beam.

The three-dimensional printing device 100 determines whether melting irradiation using the first electron beam has been completed (S1534). If the melting irradiation has not been completed (S1534; No), the three-dimensional printing device 100 sets values for the next melting irradiation using the first electron beam in the shape deforming element 30 for the first electron beam, and the common deflector 50 (S1532), and performs melting irradiation using the first electron beam (S1533).

If the melting irradiation using the first electron beam has been completed (S1534; Yes), the three-dimensional printing device 100 changes the setting about output from the calculating circuit 131 illustrated in FIG. 7 such that a shape deforming element 30 for the other of the two electron beams (e.g., the second electron beam) deforms the beam into the beam Bh having a beam width in the X-axis direction which equals the predetermined beam width Sh (S1536).

In addition, the three-dimensional printing device 100 changes the setting of the common deflector 50 for the first electron beam, and second electron beam such that the second electron beam is deflected to the deflection position (x, y) for melting irradiation (S1536).

The three-dimensional printing device 100 performs melting irradiation using the second electron beam (S1537). At this time, a value with which the first electron beam does not reach the surface 63 of the powder layer 62 is set in the beam shape deforming element 30 for the first electron beam.

The three-dimensional printing device 100 determines whether melting irradiation using the second electron beam has been completed (S1538). If the melting irradiation has not been completed (S1538; No), the three-dimensional printing device 100 sets values for the next melting irradiation using the second electron beam in the shape deforming element 30 for the second electron beam, and the common deflector 50 (S1536), and performs melting irradiation using the second electron beam (S1537). If the melting irradiation using the second electron beam has been completed (S1538; Yes), the three-dimensional printing device 100 ends the second irradiation step (S1130).

The three-dimensional printing device 100 according to the second embodiment changes the voltages to be applied to the electrostatic quadrupole electrodes constituting the beam shape deforming elements 30 to thereby deform the shapes of the first electron beam, and second electron beam into the electron beams By, Bvs, and Bvt, and Bh, Bhs, and Bht suited for melting irradiation, outlining irradiation, and preliminary irradiation, respectively. The three-dimensional printing device 100 can set the states of electron beams for individual irradiation conditions stably, and with good reproducibility.

The three-dimensional printing device 100 according to the second embodiment uses both the first electron beam having a beam width in the Y-axis direction, and the second electron beam having a beam width in the X-axis direction for irradiation of approximately the same ranges on the surface 63 of the powder layer 62.

According to the shape of the range on the surface 63 of the powder layer 62 to be melted and solidified, the three-dimensional printing device 100 can appropriately select the first electron beam, and second electron beam, and this enhances the accuracy of the shape of the cross-section layer 65 formed by melting and solidification.

Third Embodiment

A configuration example of the three-dimensional printing device 100 according to a third embodiment is explained. The three-dimensional printing device 100 according to the third embodiment includes at least two electron sources. One of the two electron sources, an electron source 20, includes an anisotropically-shaped electron emitting surface 23 with different longitudinal and lateral widths in mutually orthogonal directions. The other of the two electron sources, an electron source 21, includes an isotropically-shaped electron emitting surface having an electron emitting surface with approximately equal widths in both the directions. A beam shape deforming element 30 is constituted with electrostatic quadrupole elements having divergence directions and convergence directions approximately coinciding with the longitudinal or lateral direction of the anisotropically-shaped electron emitting surface 23.

The three-dimensional printing device 100 according to the third embodiment has a configuration equivalent to that illustrated in FIG. 1 in other respects. Portions that have functions which are approximately the same as those of the device configurations or device operations explained already are explained using the same symbols.

Figure 18A:
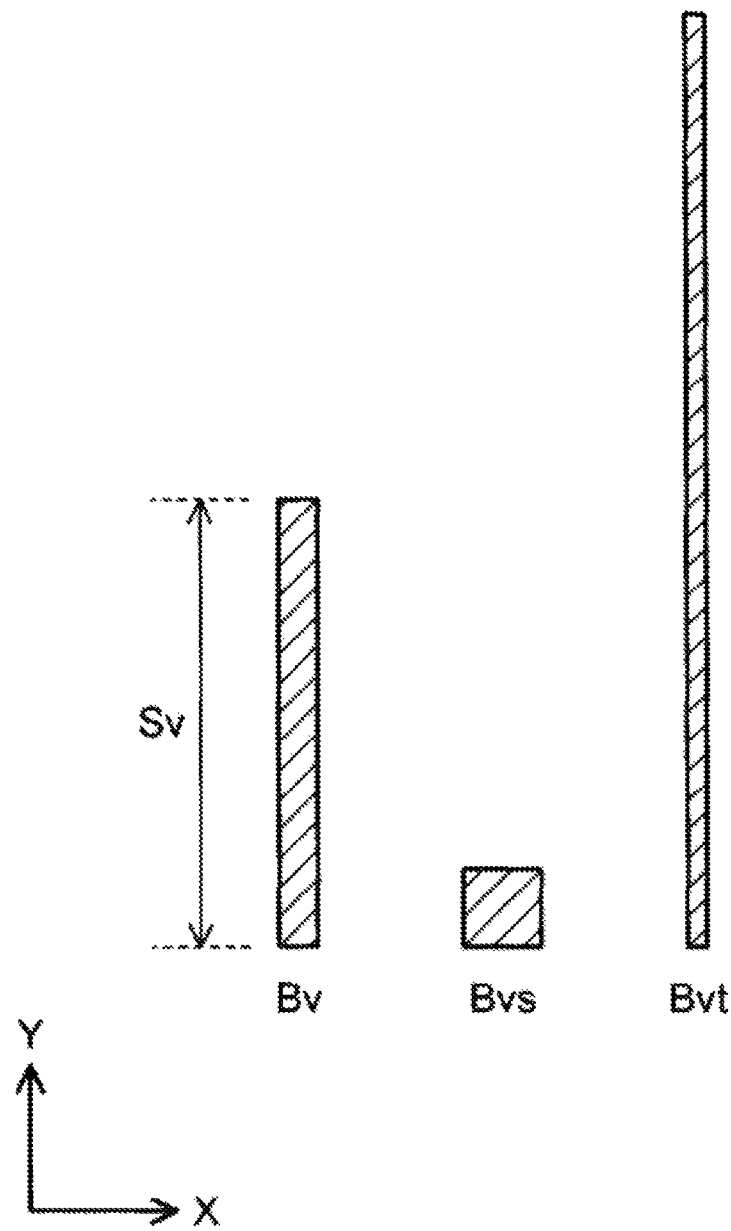
FIG. 18A is a figure illustrating cross-sectional shapes of a first electron beam of the three-dimensional printing device 100 according to a third embodiment.
Figure 18B:
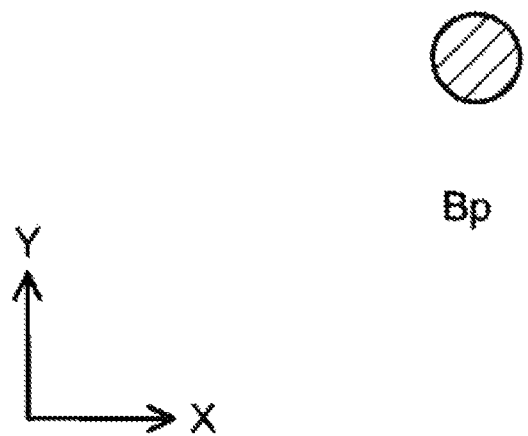
FIG. 18B is a figure illustrating cross-sectional shapes of a second electron beam of the three-dimensional printing device 100 according to the third embodiment.

FIG. 18A, and FIG. 18B correspond to FIG. 9A, and FIG. 9B explained already, and illustrate exemplary beam shapes of the first electron beam, and second electron beam of the three-dimensional printing device 100 according to the third embodiment. The first electron beam is deformed by a beam shape deforming element 30 into: an electron beam By with a longitudinal beam width approximately equal to input data Sv; an electron beam Bvs having a narrowed cross-sectional shape with approximately the same lengths in the depth and width directions; and a beam Bvt that is thin and elongated in the Y-axis direction. The second electron beam forms a beam Bp having an isotropically-shaped cross-sectional shape output from an isotropically-shaped electron emitting surface.

Figure 19:
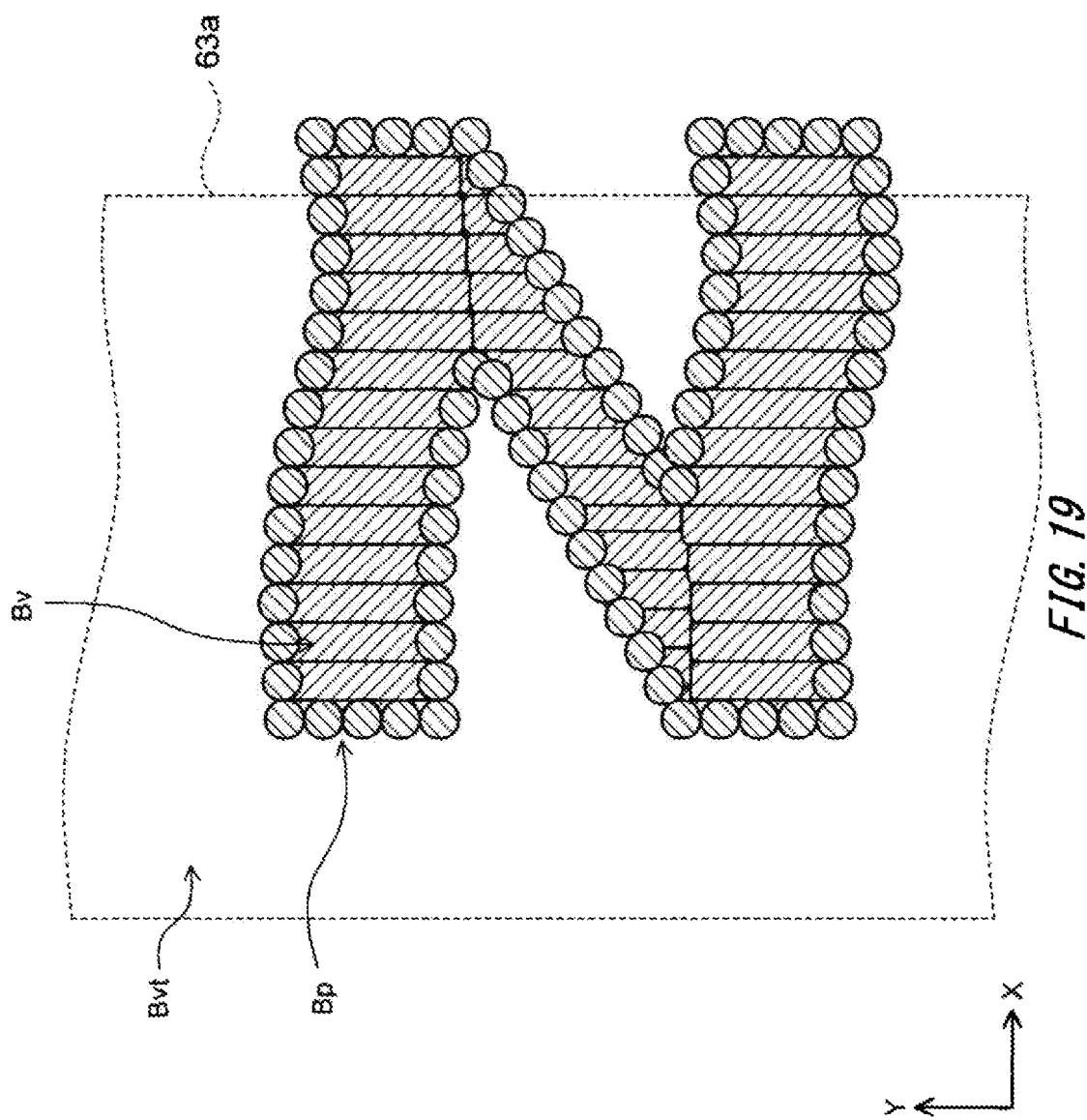
FIG. 19 is a figure illustrating ranges on a surface of a powder layer that are irradiated with electron beams, and the electron beams with which the ranges are irradiated, in the three-dimensional printing device 100 according to the third embodiment.

FIG. 19 corresponds to FIG. 10 explained already, and illustrates an exemplary preliminary irradiation region 63a on the surface 63 of the powder layer 62 irradiated with electron beams, and exemplary electron beams with which the range is irradiated, in the three-dimensional printing device 100 according to the third embodiment. In the example illustrated in FIG. 17 also, the Z-shaped range corresponds to a manufacturing region to be melted and solidified. The three-dimensional printing device 100 deforms the first electron beam into the electron beam BV, and scans all over the Z-shaped range on the surface 63 of the powder layer 62 at a predetermined beam movement speed to thereby melt the powder layer 62 in the range. The three-dimensional printing device 100 performs outlining scanning on the periphery of the Z-shaped range with the electron beam Bp having approximately the same lengths in the depth and width directions at another predetermined beam movement speed to thereby melt the periphery of the Z shape of the powder layer 62. In addition, the three-dimensional printing device 100 performs preliminary irradiation using the beam Bvt having a thin cross-sectional shape obtained by elongating the first electron beam in the Y-axis direction. The region 63a to undergo preliminary irradiation is indicated by broken lines.

Figure 20:
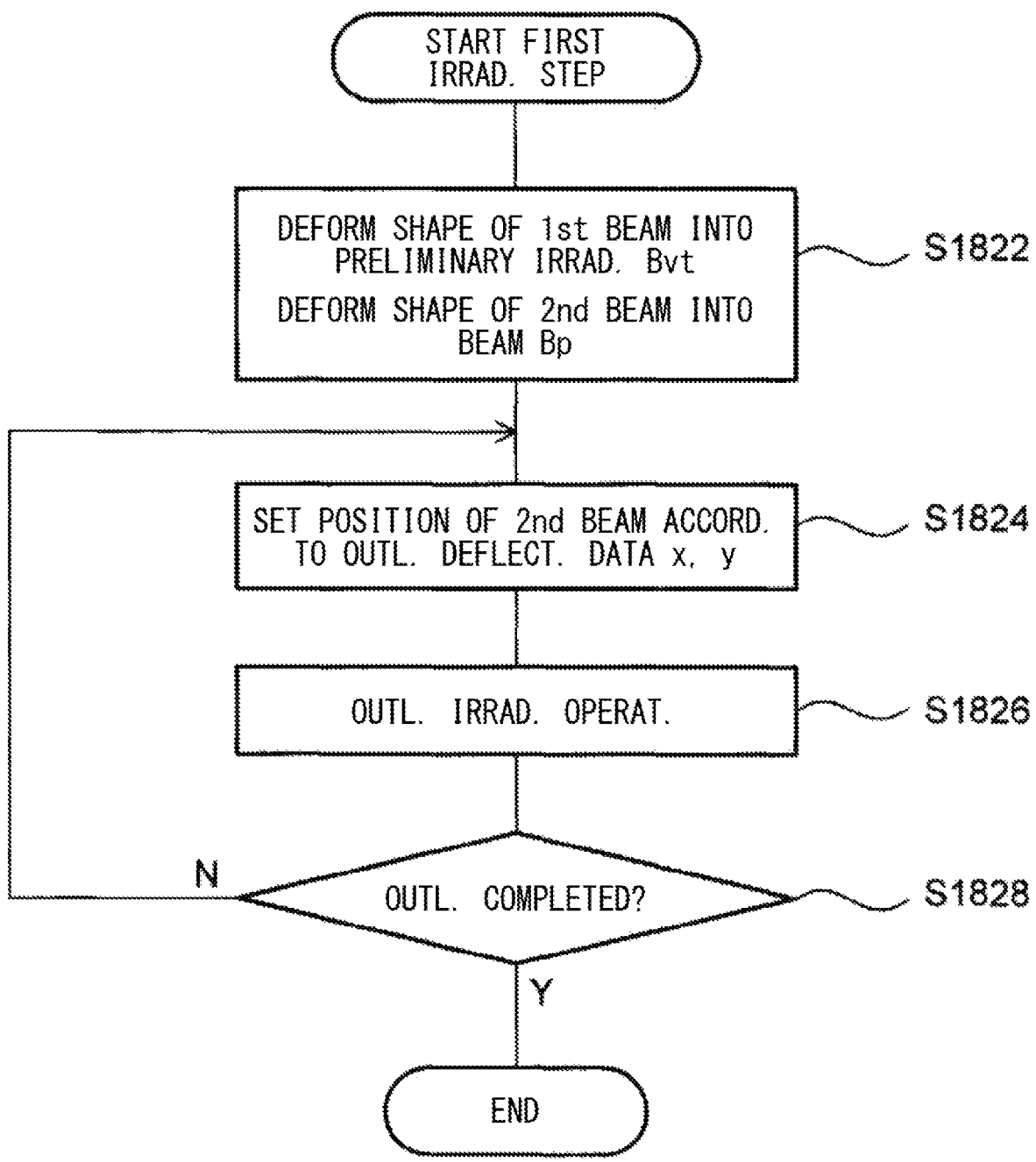
FIG. 20 is a flowchart of a first irradiation step of the three-dimensional printing device 100 according to the third embodiment.
Figure 21:
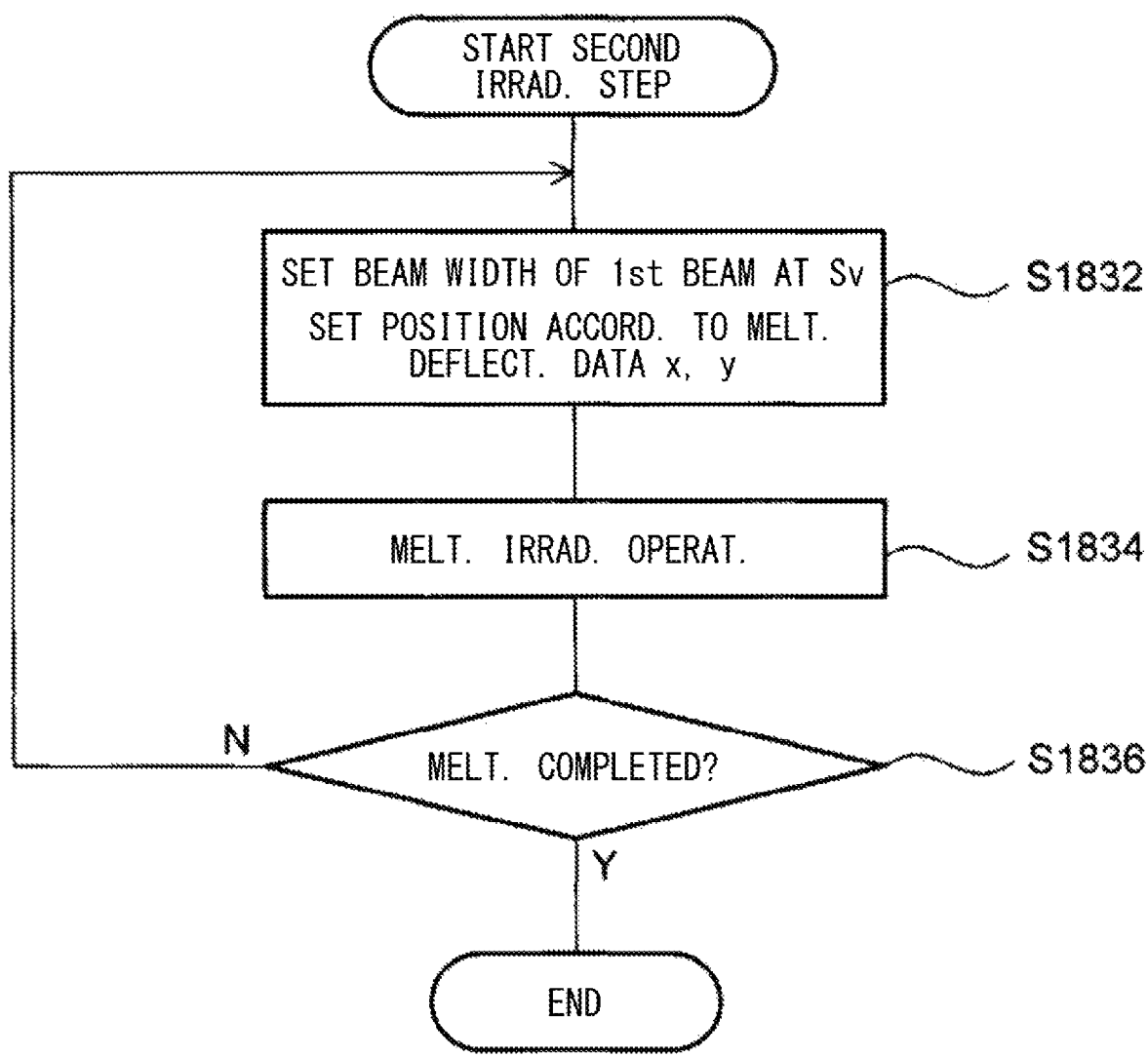
FIG. 21 is a flowchart of a second irradiation step of the three-dimensional printing device 100 according to the third embodiment.

FIG. 20, and FIG. 21 correspond to FIG. 12, and FIG. 13 explained already, and illustrate exemplary flows of operations of the first irradiation step, and the second irradiation step of the three-dimensional printing device 100 according to the third embodiment. Steps that are occupied by the first irradiation step, and the second irradiation step in the entire operation flow of the device are indicated as S1120, S1130 in FIG. 11.

If the first irradiation step (S1822 to 1828) illustrated in FIG. 20 is started, the three-dimensional printing device 100 changes the setting of a shape deforming element 30 for the first electron beam such that the beam is deformed into the beam Bvt for preliminary irradiation. The second electron beam outputs the beam Bp for outlining. The setting for the first electron beam, and second electron beam are changed such that the first electron beam, and second electron beam are to be output as the beams Bvt, and Bp, respectively, until the first irradiation step ends (S1822).

The three-dimensional printing device 100 changes the setting of the common deflector 50 for the first electron beam, and second electron beam such that the second electron beam Bp is deflected to the deflection position (x, y) for outlining (S1824). The three-dimensional printing device 100 performs outlining irradiation using the second electron beam Bp (S1826). At this time, the preliminary irradiation using the first electron beam, and the outlining irradiation using the second electron beam proceed simultaneously.

The three-dimensional printing device 100 determines whether outlining of the melting-target portion on the surface 63 of the powder layer 62 has been completed (S1828).

If the outlining has not been completed (S1828; No), the three-dimensional printing device 100 sets values for the next portion to undergo outlining using the second electron beam Bp in the common deflector 50 (S1824), and performs outlining irradiation using the second electron beam Bp (S1826). If the outlining of the melting-target portion on the surface 63 of the powder layer 62 has been completed (S1828; Yes), the three-dimensional printing device 100 ends the first irradiation step (S1120).

If the second irradiation step (S1832 to 1838) illustrated in FIG. 21 is started, the three-dimensional printing device 100 changes the setting of the shape deforming element 30 for the first electron beam about output from the calculating circuit 131 illustrated in FIG. 7 such that the beam width of the first electron beam in the Y-axis direction becomes the predetermined beam width Sv of the beam By (S1832). In addition, the three-dimensional printing device 100 changes the setting of the common deflector 50 for the first electron beam, and second electron beam such that the first electron beam is deflected to the deflection position (x, y) for melting irradiation (S1832). The three-dimensional printing device 100 performs melting irradiation using the first electron beam (S1834). At this time, a value with which the second electron beam does not reach the surface 63 of the powder layer 62 is set in an electrode corresponding to the element 30 for the second electron beam.

The three-dimensional printing device 100 determines whether melting irradiation using the first electron beam has been completed (S1836). If the melting irradiation has not been completed (S1836; No), the three-dimensional printing device 100 sets values for the next melting irradiation using the first electron beam in the shape deforming element 30 for the first electron beam, and the common deflector 50 (S1832), and performs melting irradiation using the first electron beam (S1834). If the melting irradiation using the first electron beam has been completed (S1836; Yes), the three-dimensional printing device 100 ends the second irradiation step (S1130).

The three-dimensional printing device 100 according to the third embodiment changes the voltages to be applied to the electrostatic quadrupole electrodes constituting the beam shape deforming elements 30 to thereby deform the shape of the first electron beam into the electron beams By, and Bvt suited for melting irradiation, and preliminary irradiation, respectively. The three-dimensional printing device 100 can keep the states of electron beams for individual irradiation conditions stably, and with good reproducibility.

The three-dimensional printing device 100 according to the third embodiment performs preliminary irradiation using the first electron beam simultaneously with outlining irradiation using the second electron beam. The three-dimensional printing device 100 allows reduction of time for the entire irradiation steps as compared to the case where melting irradiation, outlining irradiation, and preliminary irradiation are performed separately using a single beam.

Fourth Embodiment

A configuration example of the three-dimensional printing device 100 according to a fourth embodiment is explained.

Figure 22:
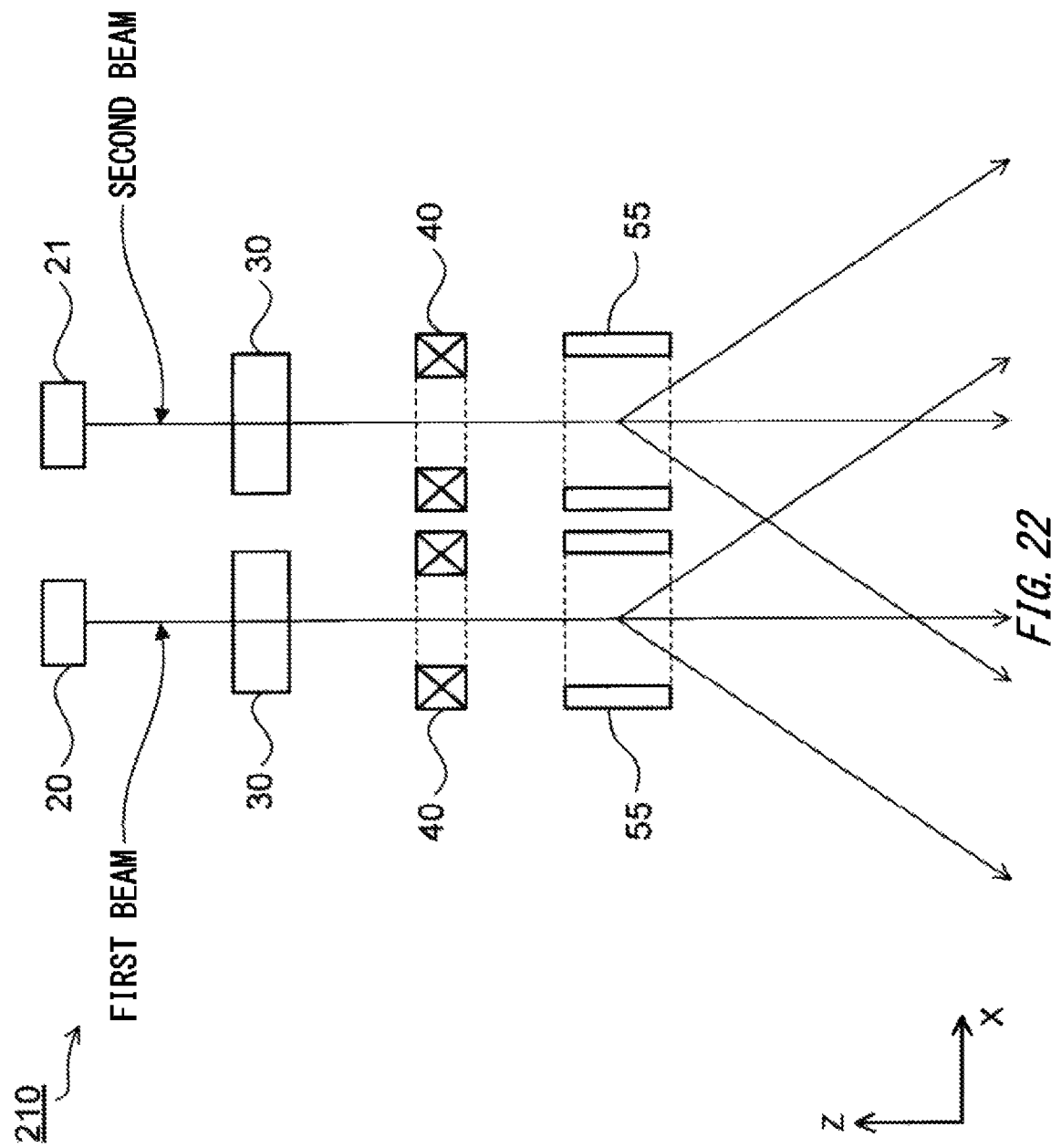
FIG. 22 is a figure illustrating a configuration example of an electron beam column 210 of the three-dimensional printing device 100 according to a fourth embodiment.

FIG. 22 illustrates a configuration example of an electron beam column 210 of the three-dimensional printing device 100 according to the fourth embodiment.

The electron beam column 210 includes at least two electron sources 20, 21.

Both the two electron sources 20, 21 may include anisotropically-shaped electron emitting surfaces 23 with different longitudinal and lateral widths in mutually orthogonal directions. Instead, one of the two electron sources 20, 21, the electron source 20, may include an anisotropically-shaped electron emitting surface 23 with different longitudinal and lateral widths in mutually orthogonal directions, and the other electron source 21 may have an isotropically-shaped electron emitting surface with approximately equal widths in both the directions. The electron sources 20, 21 generate the first electron beam and the second electron beam, respectively.

A beam shape deforming element 30 is constituted with electrostatic quadrupole elements having divergence directions and convergence directions approximately coinciding with the longitudinal or lateral direction of the anisotropically-shaped electron emitting surface 23 of the electron source 20. The electromagnetic lenses 40 converge the first electron beam, and second electron beam that pass therethrough along paths approximately coinciding with the lens axes.

The electron beam column 210 illustrated in FIG. 22 includes a plurality of deflectors 55 that deflect the first electron beam and the second electron beam separately. The deflectors 55 set the irradiation positions of the first electron beam, and second electron beam on the surface 63 of the powder layer 62 separately. The deflectors 55 that deflect a plurality of electron beams separately are desirably electrostatic deflectors. This is because even if the space between the first electron beam, and second electron beam before passing through the deflectors is approximately 30 mm, deflection electrodes of the electrostatic deflectors can be arranged to surround the passage paths of the individual beams.

The control unit 400 that controls the electron beam column 210 illustrated in FIG. 22 includes the deflection control unit 150 that outputs deflection data to each of the plurality of deflectors 55. The deflection control unit 150 outputs, separately to the deflectors 55, deflection data for irradiating the surface 63 of the powder layer 62 with the first electron beam, and second electron beam.

The three-dimensional printing device 100 according to the fourth embodiment has the configuration, and functions equivalent to that illustrated in FIG. 1 in other respects. Portions that have equivalent configurations, and functions to those of the electron beam column illustrated in FIG. 1 are given the same symbols, and explanations thereof are omitted.

The three-dimensional printing device 100 uses the beam shape deforming elements 30 to deform the first electron beam, and second electron beam into the beams By, for example, and uses the beam deflectors 55 corresponding to the first electron beam, and second electron beam, respectively, to irradiate a manufacturing region corresponding to a melting-target range on the surface 63 of the powder layer 62.

The three-dimensional printing device 100 uses the beam shape deforming elements 30 to deform the first electron beam, and second electron beam into the beams Bvs, for example, and uses the deflectors 55 corresponding to the first electron beam, and second electron beam, respectively, to irradiate outlining-target positions on the surface 63 of the powder layer 62. The three-dimensional printing device 100 uses the beam shape deforming elements 30 to deform the first electron beam, and second electron beam into the beams Bvt, for example, and uses the deflectors 55 corresponding to the first electron beam, and second electron beam, respectively, to irradiate a preliminary irradiation region on the surface 63 of the powder layer 62.

The upper limit of the distance by which the deflectors 55 deflect the first electron beam, and second electron beam is approximately 150 mm, for example. By applying an appropriate deflection voltage to the electrostatic deflectors 55, the deflectors 55 can deflect the first electron beam, and second electron beam by approximately 150 mm. Since the space between the first electron beam and the second electron beam in an in-plane direction of an X-Y plane is approximately 30 mm, for example, in this case also, the two circles on the surface 63 of the powder layer 62 that are irradiated with the first electron beam, and second electron beam have centers that are separated from each other by approximately 30 mm, have diameters of approximately 300 mm, and share a common irradiation portion.

Since the three-dimensional printing device 100 sets independent deflection output in the deflectors 55 for the first electron beam, and second electron beam, approximately the same ranges on the surface 63 of the powder layer 62 are irradiated simultaneously with the first electron beam, and second electron beam under different electron beam conditions. While melting irradiation using the first electron beam is being performed, outlining irradiation or preliminary irradiation using the second beam may be performed simultaneously. While outlining irradiation using the first electron beam is being performed, melting irradiation or preliminary irradiation using the second beam may be performed simultaneously. Alternatively, while preliminary irradiation using the first electron beam is being performed, melting irradiation or outlining irradiation using the second beam may be performed simultaneously.

The three-dimensional printing device 100 according to the fourth embodiment changes the voltages to be applied to the electrostatic quadrupole electrodes constituting the beam shape deforming elements 30 to thereby deform the shapes of the beams into the electron beams By, Bvs, and Bvt suited for melting irradiation, outlining irradiation, and preliminary irradiation, respectively.

In addition, similar to the other embodiments, the three-dimensional printing device 100 according to the fourth embodiment perform two types of irradiation among melting irradiation, outlining irradiation, and preliminary irradiation simultaneously with the first electron beam, and second electron beam, and so allows reduction of time required for the entire irradiation steps.

Note that the three-dimensional printing device 100 according to the fourth embodiment may additionally use a third electron beam in addition to the first electron beam, and second electron beam. In such a case, the electron beams may be allocated to melting irradiation, outlining irradiation, and preliminary irradiation, respectively. By the three electron beams simultaneously performing three types of irradiation (melting irradiation, outlining irradiation, and preliminary irradiation), the three-dimensional printing device 10 can allow further reduction of time required for the entire irradiation steps.

Fifth Embodiment

A configuration example of the three-dimensional printing device 500 according to a fifth embodiment is explained.

Figure 23:
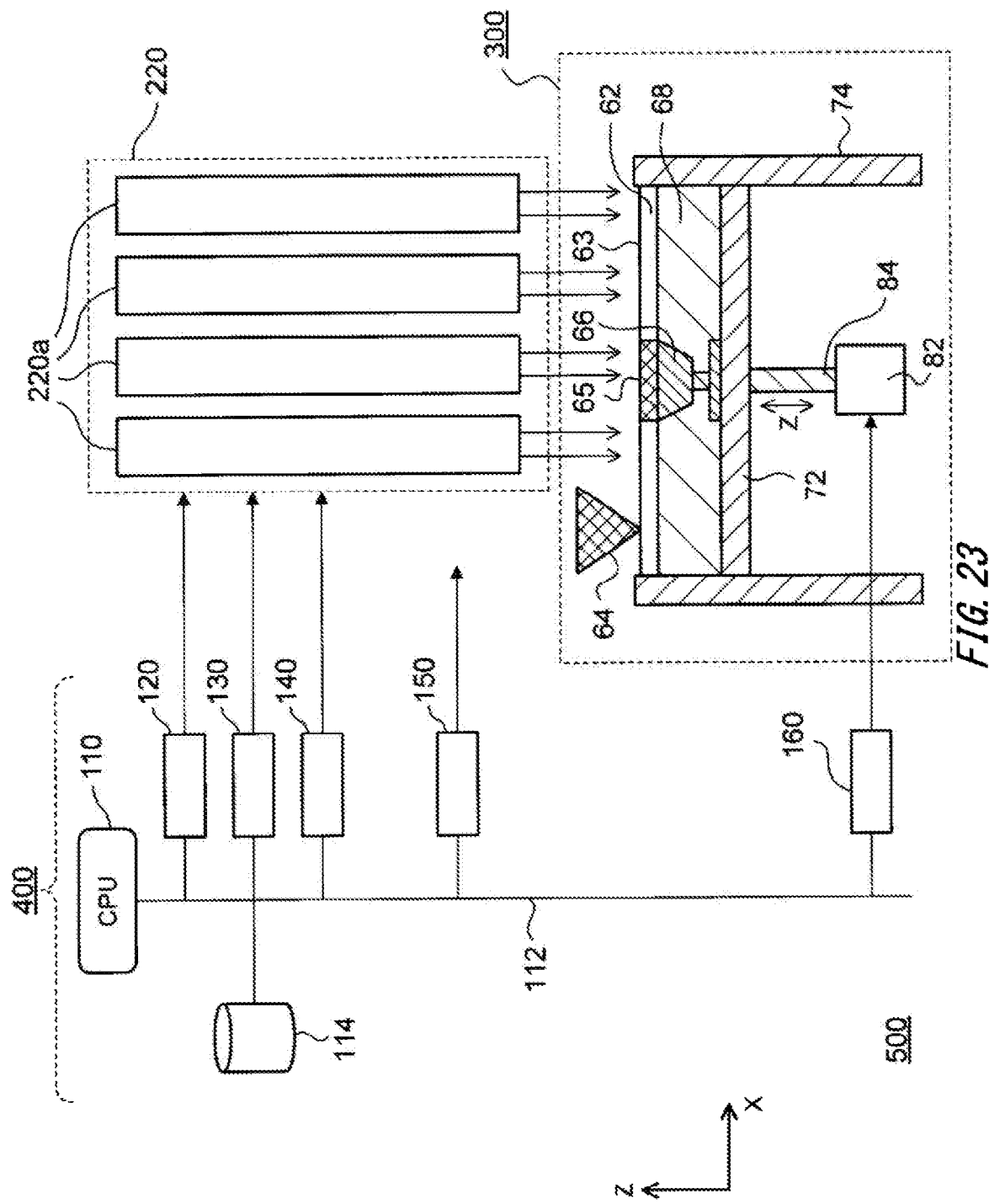
FIG. 23 is a figure illustrating a configuration example of an electron beam column 220 of a three-dimensional printing device 500 according to a fifth embodiment.

FIG. 23 is a block diagram illustrating the configuration of an electron beam column 220 of the three-dimensional printing device 500 according to the fifth embodiment.

The electron beam column 220 includes a plurality of modules 220a each including at least two electron sources. In the illustrated example, the number of such modules 220a included is four.

The configuration of each module 220a is similar to the electron beam column 200 illustrated in the FIG. 1, and a module 220a emits the first electron beam, second electron beam simultaneously, for example. It is assumed that each module 220a irradiates an approximately circular region (deflection region) having a diameter of about 300 mm, for example.

The electron beam column 220 in the present embodiment has modules 220a that are arranged with such spaces therebetween that the deflection ranges of the individual modules 220a become continuous without gaps.

Figure 24A:
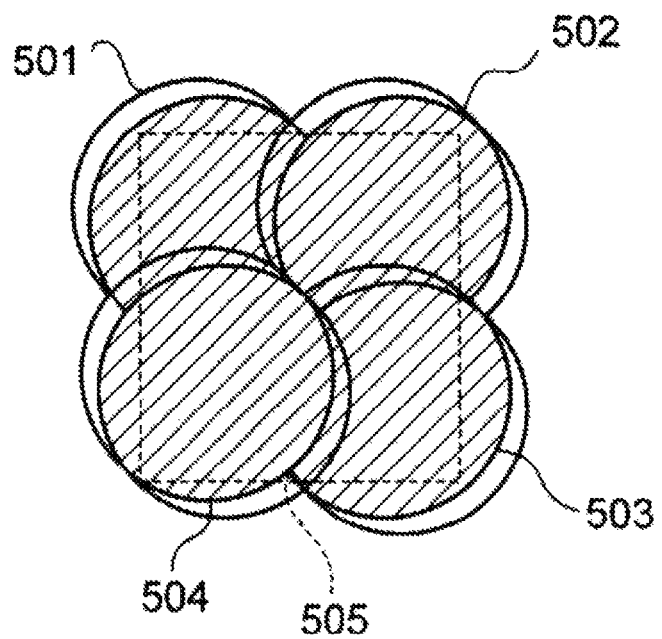
FIG. 24A is a figure illustrating irradiation ranges of the electron beam column 220 illustrated in FIG. 23.
Figure 24B:
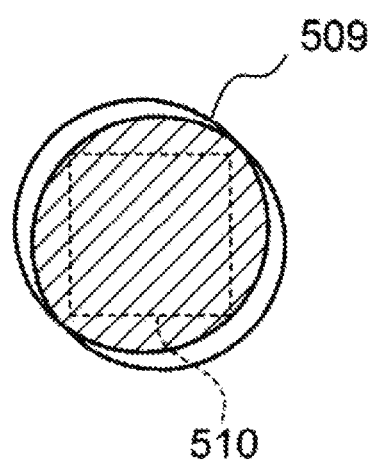
FIG. 24B is a figure illustrating irradiation ranges of the electron beam column 220 illustrated in FIG. 23.

FIG. 24A is a plan view illustrating ranges over which the electron beam column 220 performs irradiation, and FIG. 24B is a plan view illustrating ranges over which the electron beam column 200 performs irradiation.

In the example illustrated in FIG. 24A, four modules 220a are arranged. As illustrated in the figure, the modules 220a of the electron beam column 220 are arranged such that their irradiation ranges 501, 502, 503, 504 become continuous without gaps, and preliminary irradiation, melting irradiation, and outlining irradiation can be performed over the range corresponding to a rectangular region 505 indicated by broken lines.

On the other hand, for comparison, FIG. 24B illustrates a region 510 over which irradiation using the electron beam column 200 in the first embodiment can be performed.

As is apparent from FIG. 24A, and FIG. 24B, the electron beam column 220 in the present embodiment can irradiate a larger region than the electron beam column 200 in the first embodiment can, and so can print a larger manufactured object.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS 20, 21: electron source; 22: cathode portion; 23: electron emitting surface; 24: control electrode; 25: opening; 26: heating unit; 27: grounded portion; 28: opening; 29: insulating portion; 30: beam shape deforming element; 31, 32: electrostatic quadrupole element; 40: electromagnetic lens; 50, 55: deflector; 62: powder layer; 63: surface; 63a: preliminary irradiation region; 64: powder supply unit; 65: cross-section layer; 66: three-dimensional structure; 68: powder sample; 72: bottom surface portion; 74: side wall portion; 82: driving unit; 84: driving rod; 100, 500: three-dimensional printing device; 110: CPU; 112: bus; 114: external storage unit; 120: electron source control unit; 130: deforming element control unit; 131: calculating circuit; 132, 133: storage circuit; 134: switching unit; 135: digital-analog converting unit; 140: lens control unit; 150: deflector control unit; 160: height control unit; 200, 210, 220: electron beam column; 220a: module; 300: manufacturing unit; 400: control unit; 501, 502, 503, 504: irradiation range; 505, 510: region; 509: irradiation range

What is claimed is:

1. An electron beam column for a three-dimensional layering device comprising:
    a first electron source that has an anisotropically-shaped first electron emitting surface, and outputs a first electron beam accelerated to a first predetermined acceleration voltage;
    a second electron source that has an anisotropically-shaped second electron emitting surface, and outputs a second electron beam accelerated to a second predetermined acceleration voltage;
    a first beam shape deforming element that deforms a cross-sectional shape of the first electron beam;
    a second beam shape deforming element that deforms a cross-sectional shape of the second electron beam;
    an electromagnetic lens that converges the first electron beam and the second electron beam; and
    a deflector that adjusts irradiation positions of the first electron beam and the second electron beam, wherein
    the first electron source and the second electron source are oriented such that a longitudinal direction of the first electron emitting surface of the first electron source is orthogonal to a longitudinal direction of the second electron emitting surface of the second electron source, and
    a powder layer is irradiated with the first electron beam and the second electron beam simultaneously.

2. The electron beam column for the three-dimensional layering device according to claim 1, wherein
    at least one of the first beam deforming element and the second beam deforming element:
       diverges an opening angle of a corresponding one of the first electron beam and the second electron beam in the lateral direction of a corresponding one of the first electron emitting surface and the second electron emitting surface, and converges the opening angle in the longitudinal direction of the corresponding one of the first electron emitting surface and the second electron emitting surface; or
       converges the opening angle in the lateral direction of the corresponding one of the first electron emitting surface and the second electron emitting surface, and diverges the opening angle in the longitudinal direction of the corresponding one of the first electron emitting surface and the second electron emitting surface.

3. The electron beam column for the three-dimensional layering device according to claim 1, wherein the first electron beam and the second electron beam are deflected by a common deflector.

4. The electron beam column for the three-dimensional layering device according to claim 1, wherein the first electron beam and the second electron beam are deflected by different deflectors.

5. The electron beam column for the three-dimensional layering device according to claim 1, wherein
    a deflectable range of the deflector is set such that the upper limit of the deflection distance of each of the first electron beam and the second electron beam relative to its position when it is not being deflected, measured at the powder layer being irradiated, is larger than the space between the first electron beam and the second electron beam when the first electron beam and the second electron beam are not deflected.

6. The electron beam column for the three-dimensional layering device according to claim 1, wherein
    the first beam deforming element and the second beam deforming element each have multipole elements arranged at multiple stages along an advancing direction of a corresponding one of the first electron beam and the second electron beam, and
    each of the multipole elements of each of the first beam deforming element and the second beam deforming element is formed of an electrostatic quadrupole element, a direction along which a pair of pole elements of the electrostatic quadrupole element is arranged coincides with a longitudinal direction of a corresponding one of the first electron emitting surface and the second electron emitting surface, and a direction along which the other pair of pole elements of the electrostatic quadrupole element is arranged coincides with a lateral direction of the corresponding one of the first electron emitting surface and the second electron emitting surface.

* * * * *